United States Patent
Moriguchi

[11] Patent Number: 5,985,111
[45] Date of Patent: *Nov. 16, 1999

[54] WATER EVAPORATION TYPE COOLING APPARATUS BY MEANS OF ELECTROLYTIC REACTION

[75] Inventor: Tetsuo Moriguchi, Tokyo, Japan

[73] Assignee: Mitsubishi Denki Kabushiki Kaisha, Tokyo, Japan

[*] Notice: This patent is subject to a terminal disclaimer.

[21] Appl. No.: 08/952,984

[22] PCT Filed: Oct. 11, 1996

[86] PCT No.: PCT/JP96/02952

§ 371 Date: Nov. 25, 1997

§ 102(e) Date: Nov. 25, 1997

[87] PCT Pub. No.: WO97/39294

PCT Pub. Date: Oct. 23, 1997

[30] Foreign Application Priority Data

Apr. 15, 1996 [JP] Japan ................................. 8-92670

[51] Int. Cl.⁶ .................................................... C25B 9/00
[52] U.S. Cl. .......................... 204/258; 204/262; 204/265; 204/266
[58] Field of Search .................................. 204/262, 265, 204/266, 258

[56] References Cited

U.S. PATENT DOCUMENTS 5,383,340   1/1995   Larson et al. ........................... 62/259.2
5,687,576  11/1997   Moriguchi et al. ......................... 62/56

FOREIGN PATENT DOCUMENTS 63-135755   6/1988   Japan .
5-101834    4/1993   Japan .
6-21279     1/1994   Japan .

*Primary Examiner*—Kathryn Gorgos
*Assistant Examiner*—Thomas H. Parsons
*Attorney, Agent, or Firm*—Sughrue, Mion, Zinn, Macpeak & Seas, PLLC

[57] ABSTRACT

It is an object of the present invention to provide a water-evaporation type cooling apparatus which uses a solid-state electrolytic element, is free from an environmental protection problem, is soundless, and has a small size. An solid-state electrolytic element 50 is arranged to partition an airtight can 51 into spaces 51a, 51b, water 53 is reserved in the space 51a, and a condenser 55 is arranged to communicate with the space 51b. A water-reservation portion of the space 51a communicates with a water-reservation portion of the condenser 55 through a water path 57, and gas-phase portions of the spaces 51a, 51b communicate with each other through a ventilation path 58. A power is supplied from a DC power supply 52 to the solid-state electrolytic element 50 to make water decomposition reaction on an anode side and water generation reaction on a cathode side. A thermal connection surface 59 of a bottom portion of the space 51a is shaped into an outer surface shape along the outer surface shape of a target object 54.

16 Claims, 18 Drawing Sheets

WATER EVAPORATION TYPE COOLING
APPARATUS BY MEANS OF
ELECTROLYTIC REACTION

TECHNICAL FIELD

The present invention relates to a cooling apparatus for an electronic substrate on which an electronic part represented by an LSI mounted on electronic equipment or power equipment is packaged or a computer memory device and, more particularly, to a water-evaporation type cooling apparatus based on electrolytic reaction being capable of normally operating even if the cooling apparatus is installed in an environment whose temperature is equal to or higher than the maximum use temperature of the electronic part or the computer memory device.

BACKGROUND ART

As a conventional method of cooling an electronic part represented by a LSI packaged on electronic equipment or power equipment, as described in, e.g., Japanese Unexamined Patent Publication No. 6-21279, there has been known a method of radiating heat generated from a heat-generation member such as the LSI by combining a refrigerant bag and a heat pipe to each other.

Prior Art FIG. 19 is a view of the arrangement of a conventional heat-transfer apparatus described in Japanese Unexamined Patent Publication No. 6-21279.

Referring to FIG. 19, a protection metal vessel 1 has a hole portion 2 formed in a bottom portion thereof. A refrigerant bag 3 is stored in the lower portion of the protection metal vessel 1. The refrigerant bag 3 has an arrangement in which both the ends of a cylindrical member consisting of a soft plastic material such as polyethylene are sealed by means of heat fusing or the like, has an operation liquid 4 filled therein, and has a gas filled in the upper space thereof. When the refrigerant bag 3 is stored in the protection metal vessel 1, the refrigerant bag 3 partially projects from the hole portion 2 to form a contact portion 5 which is brought into contact with a target object 8 such as a LSI.

A heat-transfer pipe 6 is stored to be wrapped with the refrigerant bag 3, and a heat-radiation fin 7 is attached to one end of the heat-transfer pipe 6 which projects outside the protection metal vessel 1.

A halogen-based refrigerant such as flon or p-fluorocarbon ($C_6F_{14}$) is used as the operation liquid 4.

An operation of the conventional heat-transfer apparatus will be described below.

The heat-transfer apparatus is installed such that the contact portion 5 is brought into contact with the target object 8 such as the LSI. Heat generated by the target object 8 is transferred from the contact portion 5 to the operation liquid 4. The operation liquid 4 is evaporated by the heat transferred from the contact portion 5, and the vapor condensed at the portion where the vapor is in contact with the heat-transfer pipe 6 in the refrigerant bag 3 to be liquified and dropped. With this exchange of latent heat, the heat is absorbed by the heat-transfer pipe 6. Thereafter, the heat is radiated from the heat-radiation fin 7 attached at one end of the heat-transfer pipe 6. When such heat exchange is repeated, the target object 8 is cooled.

Since the conventional heat-transfer apparatus is arranged as described above, the target object cannot be cooled to a temperature which is equal to or lower than the outer temperature of the heat-radiation portion. The use environment of the heat-transfer apparatus is disadvantageously limited.

Since a halogen-based refrigerant such as flon or p-fluorocarbon is used as the operation liquid 4, when the apparatus is scrapped, the refrigerant must be retrieved form the apparatus for environmental protection. However, in general, many electronic equipments frequently have an unspecified number of markets as targets. Therefore, a problem caused by the retrieving method must be solved.

General electronic equipment is necessarily decreased in size, the structure of the above heat-transfer apparatus cannot be decreased in size. Therefore, a sufficient means for the decrease in size cannot be made.

DISCLOSURE OF INVENTION

The present invention has been made to solve the above problem, and has as its object to provide a water-evaporation type cooling apparatus based on electrolytic reaction which is not limited to a use environment, is free from problems on environment protection, has a small size, and is soundless.

According to the first invention, there is provided a water-evaporation type cooling apparatus based on electrolytic reaction, comprising an airtight space having a gas sealed therein; a solid-state electrolytic element which has electrodes arranged on both the surfaces of a solid high polymer electrolytic membrane allowing protons to selectively transmit therethrough and which divides the airtight space into first and second airtight spaces; a DC power supply for applying a DC current to the solid-state electrolytic element such that the electrode on the first airtight space side of the solid-state electrolytic element is used as an anode; water reserved in the first airtight space; a condenser, arranged in the second airtight space, for condensing steam; a water path for sending back the water condensed in the second airtight space to the first airtight space; and a ventilation path for performing ventilation between gas-phase portions of the first and second airtight spaces; applies a DC current to the solid-state electrolytic element to make electrolysis of steam on a surface of the solid-state electrolytic element on the first airtight space side, supplies protons generated by the electrolysis to a surface of the solid-state electrolytic element on the second airtight space side through the solid-state electrolytic element, makes water-generation reaction on the surface of the solid-state electrolytic element on the second airtight space side to generate a humidity difference between the first and second airtight spaces, lowers a temperature of the water reserved in the first airtight space, and uses, as a cooling surface, a wall surface of the first airtight space formed along the water whose temperature is lowered, wherein the wall surface of the first airtight space constituting the cooling surface is shaped into an outer surface shape along an outer surface shape of a target object.

According to the second invention, there is provided a water-evaporation type cooling apparatus based on electrolytic reaction, comprising a solid-state electrolytic element formed such that a solid high polymer electrolytic membrane which has an anode formed on one surface thereof and a cathode formed on the other surface and allows protons to selectively transmit therethrough is shaped into a corrugate-fin-like stereoscopic shape; a housing, for storing the solid-state electrolytic element to partition it in an anode-side space and a cathode-side space, having an anode-side inlet port and an anode-side outlet port which communicate with the anode-side space and a cathode-side inlet port and a cathode-side outlet port which communicate with the cathode-side space; a DC power supply for applying a DC current to the solid-state electrolytic element; an evaporator, having an evaporator inlet port and an evaporator outlet port, for evaporating water reserved in the evaporator; and a condenser, having a condenser inlet port and a condenser outlet port, for condensing steam, wherein the evaporator inlet port and the evaporator outlet port, and the anode-side outlet port and the anode-side inlet port respectively communicate with each other through pipes to constitute an anode-side circulation path for making circulation between the anode-side space and the evaporator, the condenser inlet port and the condenser outlet port, and the cathode-side outlet port and the cathode-side inlet port respectively communicate with each other through pipes to constitute a cathode-side circulation path for making circulation between the cathode-side space and the condenser, and a blower is arranged in at least one of the anode-side circulation path and the cathode-side circulation path to cause the blower to forcibly circulate a gas filled in the corresponding circulation path.

According to the third invention, there is provided a water-evaporation type cooling apparatus based on electrolytic reaction, comprising a solid-state electrolytic element formed such that a solid-state polymer electrolytic film which has an anode formed on one surface thereof and a cathode formed on the other surface and allows protons to selectively transmit therethrough is shaped into a corrugate-fin-like stereoscopic shape; a housing, for storing the solid-state electrolytic element to partition it into an anode-side space and a cathode-side space, having an anode-side inlet port and anode-side outlet port which communicate with the anode-side space and a cathode-side inlet port and a cathode-side outlet port which communicate with the cathode-side space; a DC power supply for applying a DC current to the solid-state electrolytic element; and a gas-liquid contactor which stores a filling layer to vertically partition it into an upper space and a lower space, has an outlet port communicating with the upper space and an inlet port communicating with the lower space, and has water reserved in a bottom portion thereof, wherein the inlet port and the outlet port of the gas-liquid contactor, and the anode-side outlet port and the anode-side inlet port respectively communicate with each other through pipes to constitute an anode-side circulation path for making circulation between the anode-side space and the gas-liquid contactor, a blower is arranged in the anode-side circulation path to cause the blower to forcibly circulate the gas filled in the anode-side circulation path, the bottom portion of the gas-liquid contactor communicates with the upper space of the gas-liquid contactor by a water-circulation circuit, and water reserved in the bottom portion of the gas-liquid contactor is circulated by the water-circulation circuit, and the water and the gas are brought into countercurrent contact with each other in the filling layer.

BEST MODE FOR CARRYING OUT THE INVENTION

Preferable embodiments of the present invention will be described below with reference to the accompanying drawings.

Embodiment 1

Figure 1:
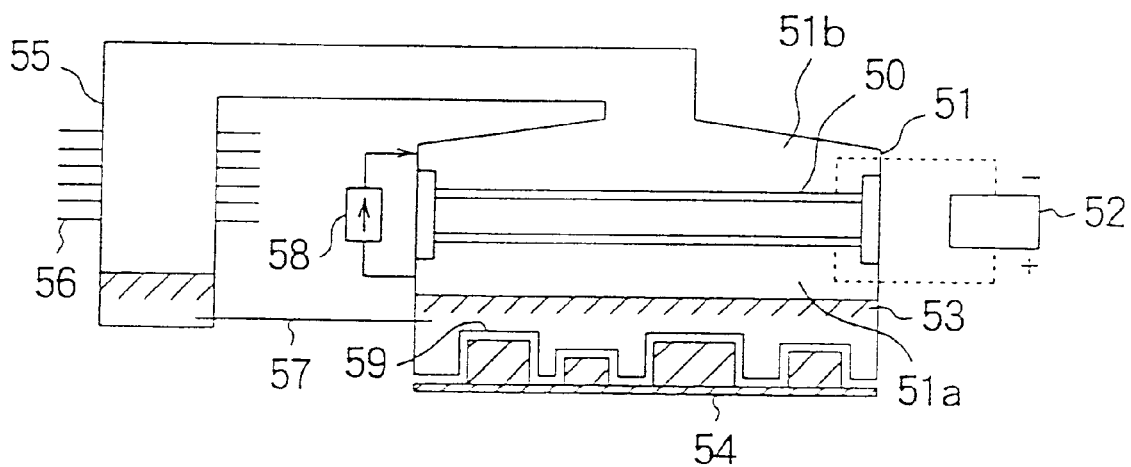
FIG. 1 is a view showing the typical arrangement of a water-evaporation type cooling apparatus based on electrolytic reaction according to Embodiment 1 of the present invention.

FIG. 1 is a view showing the typical arrangement a water-evaporation type cooling apparatus based on electrolytic reaction according to Embodiment 1 of the present invention.

Referring to FIG. 1, a solid-state electrolytic element 50 having a function of performing electrolysis of water molecules is arranged to partition an airtight can 51 serving as an airtight space into two spaces 51a and 51b serving as first and second airtight spaces. A DC current from a DC power supply 52 is applied across both the surfaces of the solid-state electrolytic element 50. Water 53 is reserved in the bottom portion of the space 51a. The water 53 thermally communicates with a target object 54. A condenser 55 is arranged to communicate with the space 51b. A heat-radiator 56 for removing heat from steam in the condenser 55 to radiate heat out of the condenser 55 is attached to the outer surface of the condenser 55, and the condenser 55 is arranged such that steam flowing from the space 51b is cooled and condensed to be reserved in the bottom portion of the condenser 55. The condensed-water-reserving portion on the bottom portion of the condenser 55 communicates with the water-reserving portion through a water path 57. The gas-phase portion of the space 51b communicates with the gas-phase portion of the space 51a through a ventilation path 58.

The interiors of the spaces 51a and 51b are reduced in pressure. An oxygen gas and steam are sealed in the spaces 51a and 51b.

In this case, a target object 54 is formed such that a plurality of electronic parts such as LSIs serving as heat generators are packaged on an electronic substrate. The surface of the target object 54 is an uneven surface corresponding to the packaging state of the plurality of electronic parts. This cooling apparatus is applied when heat from the electronic parts of the target object 54 is removed. A thermal connection surface 59 of the space 51a thermally connected to the target object 54, in this case, the bottom portion of the airtight can 51, is shaped into an uneven surface corresponding to the uneven surface of the target object 54.

The target object 54 is attached to the cooling apparatus such that the electronic parts are fitted in the recessed portions of the bottom portion of the airtight can 51. Each of the electronic parts closely contacts with the thermal connection surface 59 of the space 51a.

The arrangement of the solid-state electrolytic element 50 will be described below with reference to FIG. 2.

The solid-state electrolytic element 50 has the following arrangement. That is, an anode 41 and a cathode 42 are arranged to interpose a solid high polymer electrolytic membrane 40 which allows protons to selectively transmit therethrough through a catalyst 43 which enhances electrolytic reaction, the end portions of the solid high polymer electrolyte membrane 40, the anode 41 and the cathode 42 are held by a resin frame 44, and the anode 41 and the cathode 42 are fixed to both the surfaces of the solid high polymer electrolytic membrane 40.

As the solid high polymer electrolytic membrane 40, a proton exchange film such as Nafion-117 (trademark of Du Pont) is used.

As the anode 41 and the cathode 42, mesh members made of titanium, tantalum or stainless steel metalized with platinum, metal-plated members using fibers as an electric feeder, and porous electrodes such as unwoven carbon fibers are used.

An operation of Embodiment 1 will be described below.

When a DC voltage from the DC power supply 52 is applied across the anode 41 and the cathode 42, oxidation/reduction reaction expressed by the following equations occur on both the electrode surfaces. At this time, as shown in FIG. 2, H$^+$ (protons) generated by electrolysis of water at the anode 41 are supplied to the cathode 42 through the solid high polymer electrolytic membrane 40 to be used for generation of water.

Therefore, electrolysis of water occurs at the anode 41, and water is generated by the cathode 42. As a result, steam on the anode 41 side is transferred to the cathode 42 side and oxygen on the cathode 42 side is transferred to the anode 41 side.

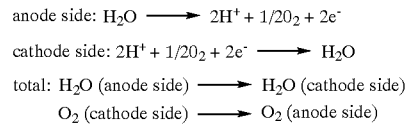

anode side: $H_2O \longrightarrow 2H^+ + 1/2O_2 + 2e^-$ cathode side: $2H^+ + 1/2O_2 + 2e^- \longrightarrow H_2O$ total: $H_2O$ (anode side) $\longrightarrow H_2O$ (cathode side)

$O_2$ (cathode side) $\longrightarrow O_2$ (anode side)

When the solid-state electrolytic element 50 is arranged such that the anode 41 is located on the space 51a side, steam in the space 51a is transferred to the space 51b side by this reaction, and oxygen in the space 51b is transferred to the space 51a. For this reason, a humidity in the space 51a decreases, evaporation of the water 53 reserved in this space is accelerated to cause a decrease in temperature.

Since the water 53 reserved in the space 51a is thermally connected to the target object 54 through the thermal connection surface 59, heat generated in the target object 54 is absorbed by the water 53 whose temperature decreases in the space 51a. In this manner, the target object 54 is cooled, and the water 53 is evaporated by heat absorption. The evaporated steam is drawn up to the space 51b by the steam draw-up operation of the solid-state electrolytic element 50, the space 51a is always kept at a low humidity, and evaporation of the water 53 is accelerated.

The steam drawn up from the space 51a to the space 51b flows into the condenser 55 connected to the space 51b as a passage. The steam flowing into the condenser 55 is cooled such that heat of the steam is radiated out by the heat-radiator 56, and is reserved in the bottom portion of the condenser 55 as condensed water. The condensed water reserved in the bottom portion of the condenser 55 is sequentially sent back to the bottom portion of the space 51a through the water path 57. In this manner, the water 53 in the space 51a is circulated without using a mechanical means such as a pump.

On the other hand, by an oxidation molecule transfer function of the solid-state electrolytic element 50 having the steam draw-up operation, an oxygen gas in the space 51b is transferred into the space 51a. In this manner, a pressure in the space 51a increases, a pressure in the space 51b decreases, and the spaces are different in pressure. By the pressure difference, an oxygen gas in the space 51a is sent back to the space 51b through the ventilation path 58. Therefore, a reciprocal transfer operation of steam and an oxygen gas by the solid-state electrolytic element 50 is continued and kept.

A principle that the arrangement of the cooling apparatus according to the present invention can cool the target object 54 will be described below.

Figure 3:
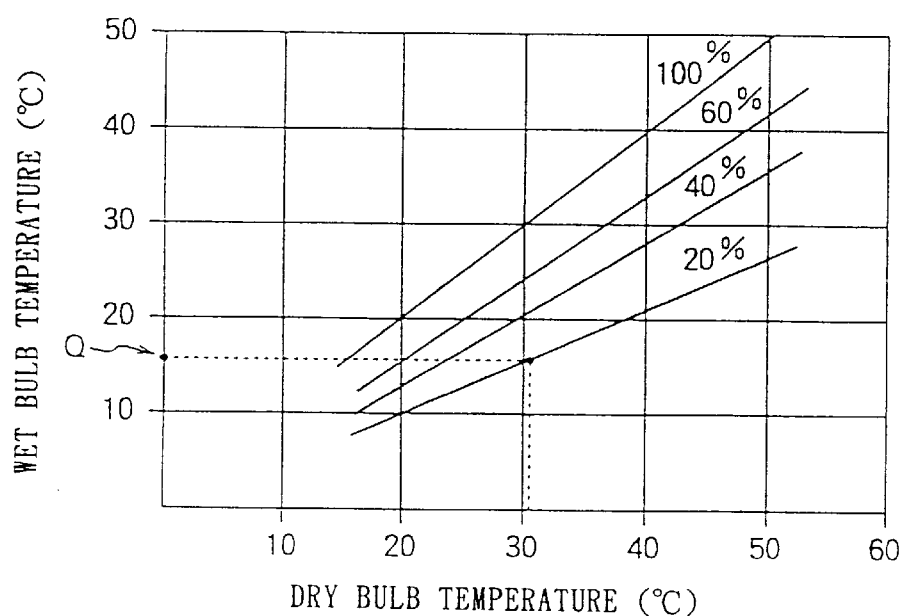
FIG. 3 is a graph showing the relationship between a dry bulb and a wet bulb in a case wherein water is in contact with a gas.

FIG. 3 is a graph showing a moisture content of a gas, i.e., the relationship between a dry bulb temperature and a wet bulb temperature with respect to a relative humidity in a state wherein water is in contact with the gas. The dry bulb temperature is the temperature of the gas which is in contact with the water, and the temperature of the water which is in contact with the gas decreases to be as close to the wet bulb temperature as possible.

For example, as indicated by a broken line in FIG. 3, the dry bulb temperature of a gas having a temperature of 30° C. and a relative humidity of 20% is a value (16° C.) indicated by point Q. For this reason, the temperature of water which is in contact with the gas decreases to 16° C.

Therefore, when water which is in contact with a gas having a low humidity is thermally connected to the target object 54, the target object 54 can be cooled to an atmospheric temperature or less.

In this manner, according to Embodiment 1, the cooling apparatus comprises the solid-state electrolytic element 50 arranged such that the airtight can 51 in which a gas consisting of oxygen and steam is sealed is divided into two spaces 51a and 51b, the water 53 reserved in the space 51a, the condenser 55 communicating with the space 51b, the water path 57 communicating with the condensed-water-portion of the condenser 55 and the water-reserving portion of the space 51a, the ventilation path 58 communicating the gas-phase portions of the spaces 51a and 51b, and the DC power supply 52 for applying a DC voltage across both the surfaces of the solid-state electrolytic element 50. Therefore, the water 53 and the gas are circulated without using a mechanical means such as a pump, the cooling apparatus is constituted by stationary equipment, and constituent parts are reduced in number. The cooling apparatus which can be decreased in size, can perform micro-level or small-scale cooling such as local cooling on an electronic substrate, and is soundless can be obtained. In addition, since the cooling apparatus has no drive section formed therein, a maintenance-free cooling apparatus can be obtained.

Since water is used as a refrigerant, unlike a conventional apparatus using a refrigerant such as flon, a means for environmental protection is not required.

Since the gas sealed in the spaces 51a and 51b consists of an oxygen gas and steam, only a factor which contributes to electrolysis is present in the spaces 51a and 51b. As a result, reaction speed can be increased, and cooling performance can be improved.

Since the bottom portion of the airtight can 51, i.e., the thermal connection surface 59 is shaped into an uneven surface to be in tight contact with the outer shape of the target object 54 and to be along the outer shape in advance, the thermal connection surface 59 can be in tight contact with the target object 54. Heat from the target object 54 is rapidly absorbed by the water 53 through the thermal connection surface 59, and the target object 54 can be efficiently cooled.

Embodiment 2

Figure 4:
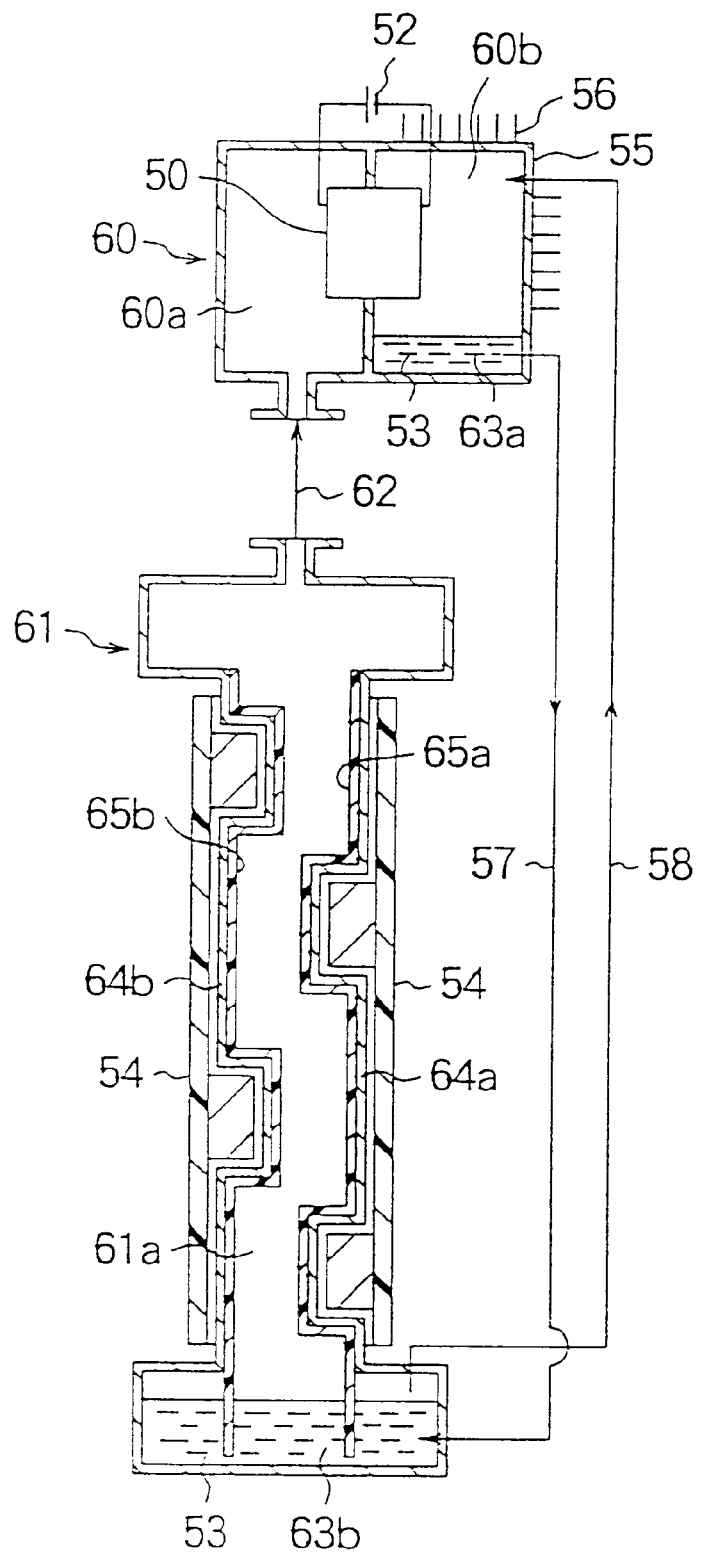
FIG. 4 is a view showing the typical arrangement of a water-evaporation type cooling apparatus based on electrolytic reaction according to Embodiment 2 of the present invention.

FIG. 4 is a view showing the typical arrangement of a water-evaporation type cooling apparatus based on electrolytic reaction according to Embodiment 2 of the present invention.

Referring to FIG. 4, an airtight can 51 according to Embodiment 1 described above can be constituted by two airtight cans 60 and 61 communicating with each other through a ventilation member 62. The solid-state electrolytic element 50 is arranged to divide the airtight can 60 into two spaces 60a and 60b. A heat-radiator 56 is attached to the outer surface of the airtight can 60 constituting the space 60b to constitute a condenser 55. The space 61a formed by the airtight can 61 communicates with the space 60a through the ventilation member 62. The spaces 60a and 61a are vertically arranged such that the space 60a is located above the space 61a. A condensed-water-reserving portion 63a on the bottom portion of the space 60b communicates with a water-reserving portion 63b on the bottom portion of the space 61a through a water path 57, and the spaces 60b and 60a constitute a water-sealing structure. The gas-phase portion of the space 60b communicates with the gas-phase portion of the space 61a through a ventilation path 58. The spaces 60a and 61a constitute a first airtight space, and the space 60b constitutes a second airtight space. The space 60a corresponds to a first space, and the space 61a corresponds to a second space. The spaces 60a, 60b, and 61a are reduced in pressure. An oxygen gas and steam are sealed in the spaces 60a, 60b, and 61a.

Opposite wall surfaces which form the space 61a of the airtight can 61 are shaped into an uneven surface corresponding to the uneven surface of target objects 54 in advance to constitute cooling surfaces 64a and 64b. The cooling surfaces 64a and 64b are shaped such that the recessed portions are prevented from being opposite to each other. A porous plate, a net-like plate, a film-like plate, or the like having good heat conductivity and water-absorbing properties is fixed to the inner wall surfaces of the cooling surfaces 64a and 64b to form water-bearing layers 65a and 65b. The lower ends of the water-bearing layers 65a and 65b are dipped in water 53 reserved in the condensed-water-reserving portion 63a, and the water 53 is absorbed by the capillarity of the water-bearing layers 65a and 65b to form water films on the inner wall surfaces of the cooling surfaces 64a and 64b. Water condensed by the condenser 55 and reserved in the condensed-water-reserving portion 63a is supplied into the water-reserving portion 63b so as to keep the wetting states of the water-bearing layers 65a and 65b.

In order to cool the target object 54 by the cooling apparatus having the above arrangement, the heat-generation portions such as electronic parts of the target object 54 are fitted in the recessed portions of the cooling surfaces 64a and 64b to attach the target object 54 to the cooling surfaces 64a and 64b. Therefore, the heat-generation portions such as electronic parts are in tight contact with the cooling surfaces 64a and 64b, heat generated by the electronic parts are absorbed by water born by the water-bearing layers 65a and 65b, thereby cooling the target object 54.

In this manner, in Embodiment 2, the water-bearing layers 65a and 65b are arranged in spaces formed on the anode 41 side of the solid-state electrolytic element 50. For this reason, as in Embodiment 1, steam in the spaces 60a and 61a are apparently transferred to the space 60b, and oxygen molecules in the space 60b is transferred to the spaces 60a and 61a. As a result, the spaces 60a and 61a decrease in humidity, and the space 60b increases in humidity. The surface of water born by the water-bearing layers 65a and 65b is brought into contact with a gas having a low humidity to decrease the water in temperature. Therefore, the cooling surfaces 64a and 64b are cooled, and the target object 54 thermally connected to the cooling surfaces 64a and 64b can be efficiently cooled.

The condenser 55 is arranged above the space 61a, and the space 60a and the space 61a are vertically arranged such that the space 60a is arranged above the space 61a. The condensed-water-reserving portion 63a is arranged on the bottom portion of the condenser 55, and the water-reserving portion 63b is arranged on the bottom portion of the space 61a. The condensed-water-reserving portion 63a communicates with the water-reserving portion 63b through the water path 57, and the lower ends of the water-bearing layers 65a and 65b are dipped in the water 53. Since steam in the space 61a has a specific weight smaller than that of oxygen, the steam is transferred to the upper space 60a through the ventilation member 62 by gravity difference. The steam in the space 60b is condensed by the condenser 55 to obtain condensed water. The condensed water is recovered by the condensed-water-reserving portion 63a by means of dripping. The water 53 reserved in the condensed-water-reserving portion 63a is sent back to the water-reserving portion 63b through the water path 57 and absorbed into the water-bearing layers 65a and 65b by capillarity thereof, and the water-bearing layers 65a and 65b are kept in a wetting state. Water born by the water-bearing layers 65a and 65b is evaporated from the surfaces of the water-bearing layers 65a and 65b into the space 61a, and circulation of water and steam is continued without driving force.

On the other hand, the spaces 60a and 61a increase in pressure by oxygen gas transfer from the space 60b. The oxygen gas has a specific weight larger than that of steam. The oxygen gas flows from the space 60a into the space 61a through the ventilation member 62, and then falls on the bottom of the space 61a. The oxygen gas is sent back from the space 61a to the space 60b through the ventilation path 58 by the above pressure difference without driving force.

The oxygen gas flowing from the space 60a into the space 61a through the ventilation member 62 falls along the surfaces of the water-bearing layers 65a and 65b to form a low-humidity environment on the surfaces of the water-bearing layers 65a and 65b, thereby accelerating evaporation of water.

Therefore, according to Embodiment 2, the same effect as in Embodiment 1 can be obtained.

Since the cooling surfaces 64a and 64b are shaped into uneven surfaces corresponding to the uneven surfaces of the target objects 54 in advance, the cooling surfaces 64a and 64b are brought into tight contact with the target objects 54, thereby efficiently cooling the target objects 54.

Since the target objects 54 can be cooled by the cooling surfaces 64a and 64b serving as the front and rear surfaces, the entire system can be made compact.

Since the cooling surfaces 64a and 64b are formed such that the recessed portions of the cooling surfaces 64a and 64b are not opposite to each other, the projection portions of the target object 54 attached to the cooling surface 64a are located at the recessed portions of the target object 54 attached to the cooling surfaces 64a and 64b, respectively, and a pair of target objects 54 are attached to the cooling surfaces 64a and 64b to be engaged with the cooling surfaces 64a and 64b. Therefore, equipment which is excellent in earthquake resistance and shock resistance can be constituted, and the entire system can be made more compact.

Embodiment 3

Figure 5:
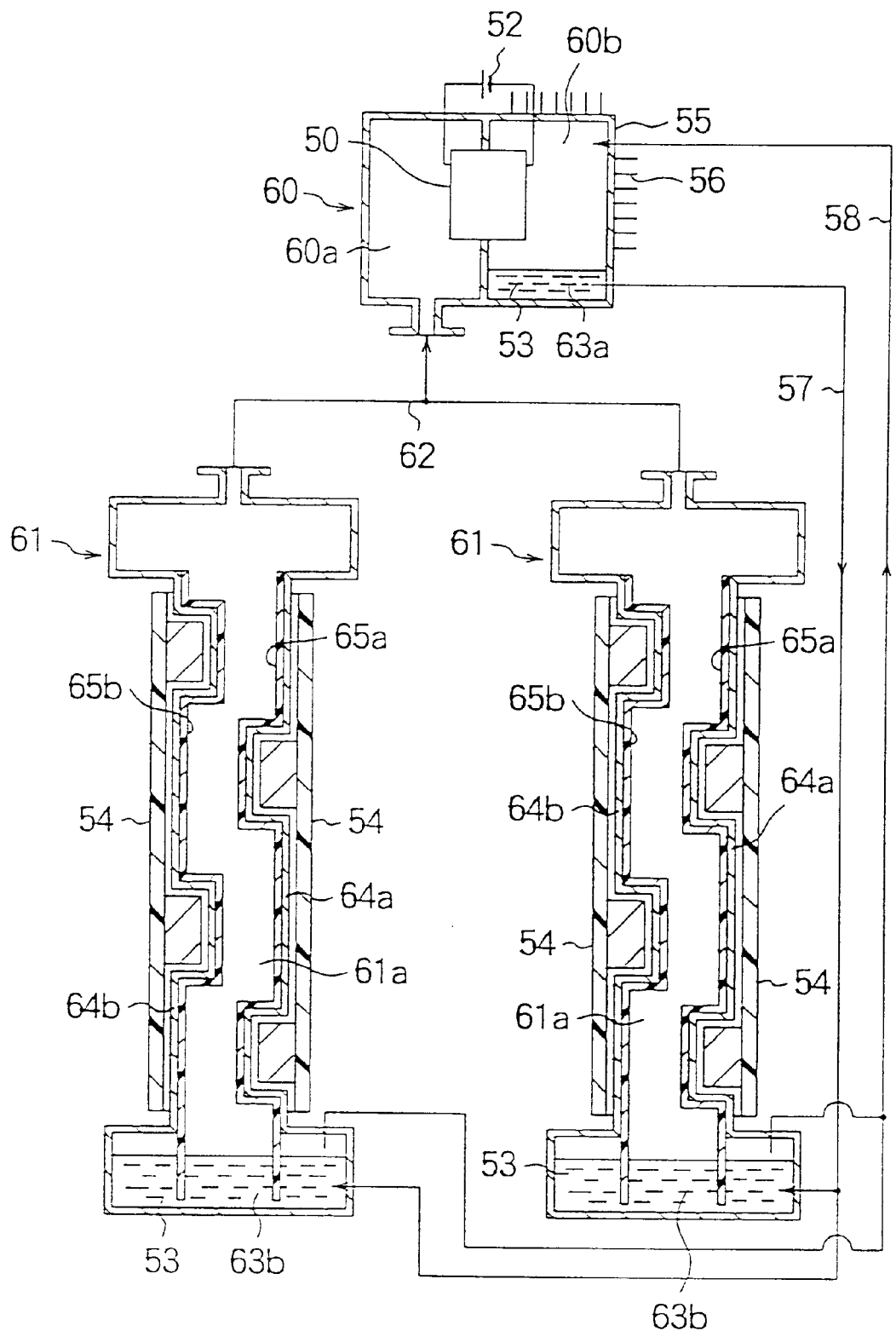
FIG. 5 is a view showing a water-evaporation type cooling apparatus based on electrolytic reaction according to Embodiment 3 of the present invention.

In Embodiment 2, the airtight can 60 is divided into two spaces 60a and 60b by the solid-state electrolytic element 50, the space 60b and the condenser 55 are integrated with each other, and the airtight can 61 having the cooling surfaces 64a and 64b formed on the front and rear surfaces thereof communicates with the space 60a of the airtight can 60 through the ventilation member 62. However, according to Embodiment 3, as shown in FIG. 5, two airtight cans 61 comprising cooling surfaces 64a and 64b formed on the front and rear surfaces thereof communicate with a space 60a of an airtight can 60 through a ventilation member 62.

In this case, four target objects 54 can be simultaneously cooled by one cooling apparatus, and the entire system can be made compact.

Embodiment 4

Figure 6:
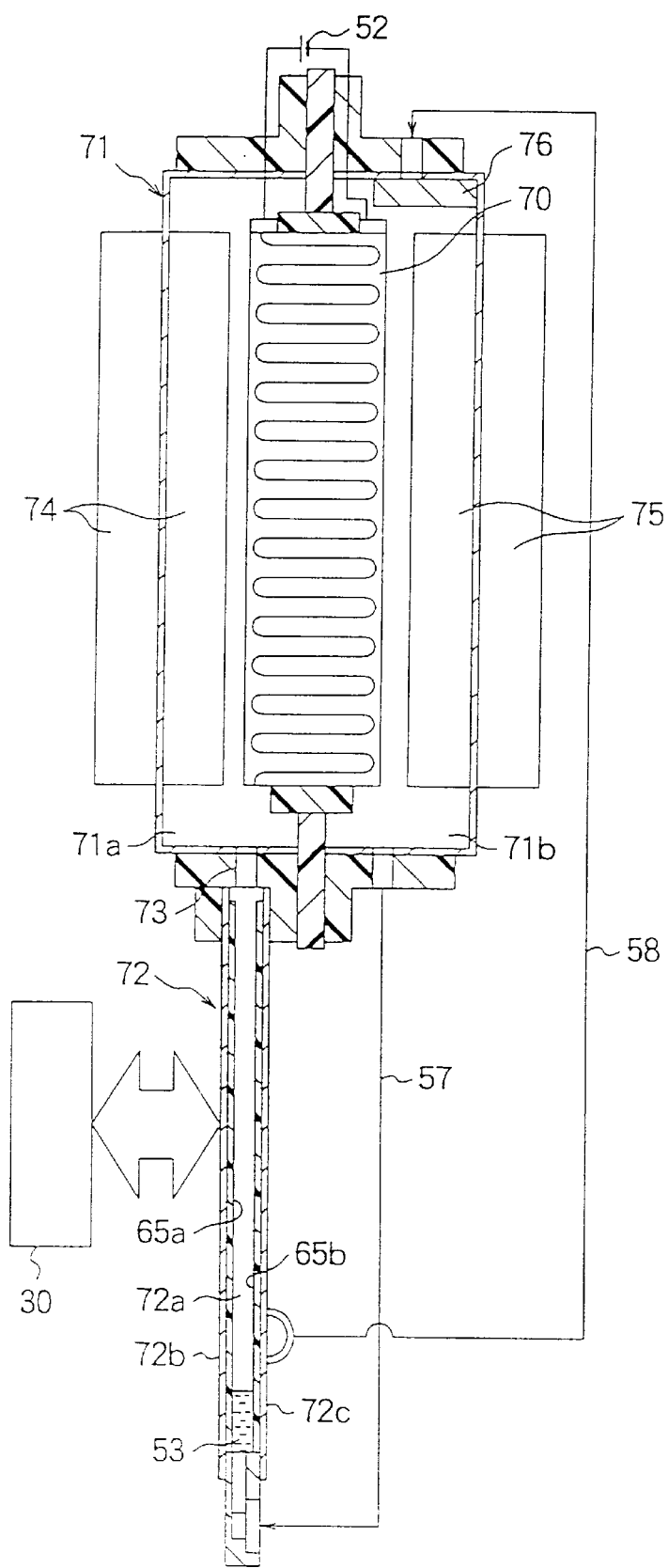
FIG. 6 is a view showing the typical arrangement of a water-evaporation type cooling apparatus based on electrolytic reaction according to Embodiment 4 of the present invention.

FIG. 6 is a view showing the typical arrangement of a water-evaporation type cooling apparatus based on electrolytic reaction according to Embodiment 4 of the present invention.

Referring to FIG. 6, a solid-state electrolytic element 70 is arranged to divide an airtight can 71 serving as an airtight space into spaces 71a and 71b serving as first and second airtight spaces, and a DC voltage from a DC power supply 52 is applied across both A the surfaces of the solid-state electrolytic element 70. A airtight can 72 communicates with the lower portion of the airtight can 71 through a communication hole 73. At this time, a space 72a formed by the airtight can 72 communicates with the space 71a through the communication hole 73, and constitutes the first airtight space together with the space 71a. The space 71a corresponds to the first space, and the space 72a corresponds to the second space.

Water-bearing layers 65a and 65b are formed on the opposite inner wall surfaces of the airtight can 72 which forms the space 72a. The wall surfaces 72b and 72c along the water-bearing layers 65a and 65b function as cooling surfaces. Water 53 is reserved in the bottom portion of the airtight can 72. The lower ends of the water-bearing layers 65a and 65b are dipped in the water 53 and absorb the water by capillarity. The water-bearing layers 65a and 65b are always kept in a wetting state. A target object 30 is thermally connected to the wall surfaces 72b and 72c serving as cooling surfaces.

A heat-radiator 74, opposing the solid-state electrolytic element 70, for radiating heat out of the cooling apparatus is attached to a portion of the wall surface of the airtight can 71 which forms the space 71a. A heat-radiator 75, opposing the solid-state electrolytic element 70, for radiating heat out of the cooling apparatus is attached to a part of the wall surface of the airtight can 71 which forms the space 71b. The heat-radiator 75 functions as a condenser for condensing steam in the space 71b.

A rare metal catalyst layer 76 is arranged at the top portion of the space 71b. The rare metal catalyst layer 76 consists of a platinum, ruthenium, or palladium fine powder or a material obtained by carrying the above metal on the surface of a granular structure, a pellet, or a honeycomb structure obtained by shaping a metal oxide such as ferrite or titanium oxide. The structure in the layer can be ventilated.

The bottom portion of the space 71b communicates with the bottom portion of the space 72a through a water path 57. Water 53 is reserved in the bottom portion of the space 72a to form a water-sealing structure between the spaces 71b and 72a. A portion near the upper portion of the reserved water surface in the space 72a communicates with the rare metal catalyst layer 76 at the top portion of the space 71b through a ventilation path 58 to form a structure which can be ventilated.

In this case, the arrangement of the solid-state electrolytic element 70 will be described below with reference to FIG. 7.

A pair of electric feeders 77a and 77b are arranged parallel to each other. The electric feeder 77a has a plurality of pins 78 extending at a predetermined pitch. The electric feeder 77b has a plurality of U-shaped members 79 extending at a predetermined pitch. A solid high polymer electrolytic membrane 40 having an anode 41 and a cathode 42 formed on both the surfaces of the solid high polymer electrolytic membrane 40 through a catalyst 43 is alternately wound around the pins 78 and the U-shaped member 79. The electric feeders 77a and 77b and the solid high polymer electrolytic membrane 40 are integrally supported by a resin frame 44 to constitute the solid-state electrolytic element 70. The solid-state electrolytic element 70 is folded at the pins 78 and the U-shaped members 79 to be shaped into a corrugate shape (wavy shape). At least some of the plurality of pins 78 and U-shaped members 79 consists of a conductive material, and the anode 41 and the cathode 42 are electrically connected to the electric feeders 77a and 77b through the pins 78 and the U-shaped members 79.

Figure 2:
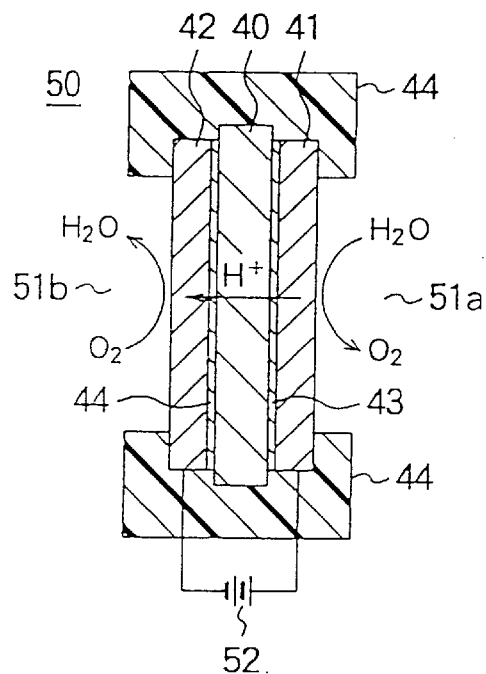
FIG. 2 is a sectional view showing the typical arrangement of a solid-state electrolytic element used in the water-evaporation type cooling apparatus based on electrolytic reaction according to Embodiment 1 of the present invention.

The solid-state electrolytic element 70 is basically constituted in the same manner as that of the solid-state electrolytic element 50 shown in FIG. 2 except that the solid-state electrolytic element 70 is shaped into a corrugate shape.

An operation of Embodiment 4 will be described below.

The anode surface of the solid-state electrolytic element 70 is arranged on the space 71a side, and the cathode surface of the solid-state electrolytic element 70 is arranged on the space 71b side. When a DC voltage is applied from a DC power supply 52, electrolytic reaction occurs at the anode 41 and the cathode 42. Electrolysis of steam occurs on the anode side to generate oxygen, and saturated oxygen is consumed on the cathode side to generate steam. More specifically, the steam on the anode side is apparently transferred to the cathode side, and the oxygen on the cathode side is apparently transferred to the anode side. In this manner, the space 71a is reduced in humidity, and the space 71b is increased in humidity.

When the space 71a is reduced in humidity, the space 72a communicating with the space 71a through the communication hole 73 is also reduced in humidity. Since the space 72a is kept in a low humidity, moisture evaporation from the surfaces of the water-bearing layers 65a and 65b is accelerated to cause water born by the water-bearing layers 65a and 65b to decrease in temperature. When the water born by the water-bearing layers 65a and 65b is evaporated, the water 53 reserved in the bottom portion of the space 72a is absorbed by the water-bearing layers 65a and 65b by means of capillarity to make water supply.

Since the target object 30 is thermally connected to the wall surfaces 72b and 72c along the water-bearing layers 65a and 65b, heat from the target object 30 is absorbed by water born by the water-bearing layers 65a and 65b through the wall surfaces 72b and 72c, thereby cooling the target object 30.

Steam evaporated from the surfaces of the water-bearing layers 65a and 65b flows into the space 71a *through the communication hole 73 to be brought into contact with the heat-radiator 74.*

Here, when the outer temperature of the heat-radiator 74 is equal or lower than the upper limit temperature at which the target object 30 is kept cool, the steam is cooled by the heat-radiator 74 to be condensed, and the condensed water flows into the space 72a through the communication hole 73 by gravity and absorbed by the water-bearing layers 65a and 65b. In this case, the spaces 71a and 72a are vertically arranged, the heat-radiator 74 is arranged in the upper space 71a, and the water-bearing layers 65a and 65b are arranged in the lower space 72a to constitute a heat pipe. Heat from the target object 30 can be radiated out of the apparatus through the heat-radiator 74 without driving force.

When the outer temperature of the heat-radiator 74 is equal to or higher than the upper limit temperature at which the target object 30 is kept cool, for example, when the upper limit of the allowance temperature of the target object 30 is 40° C., and the outer temperature of the target object 30 is 50° C., steam is not condensed by the heat-radiator 74.

In this case, a voltage is applied from the DC power supply 52 to the solid-state electrolytic element 70, steam on the anode side is transferred to the cathode side, and oxygen is transferred from the cathode side to the anode side. In this manner, steam in the space 71a is transferred into the space 71b to substantially keep the space 71b in a saturated steam state. Heat from the steam in the space 71b is radiated out of the heat-radiator 75 to condense the steam. The condensed water is reserved in the bottom portion of the space 71b and sequentially sent back to the space 72a through the water path 57.

An oxygen gas generated by electrolytic reaction of the solid-state electrolytic element 70 in the space 71a has a specific weight larger than that of steam, the oxygen gas flows into the space 72a by gravity through the communication hole 73. At this time, although the oxygen gas receives Joule heat generated by the energizing process of the solid-state electrolytic element 70 to be heated, the heat-radiator 74 functions to cool the oxygen gas, and the cooled oxygen gas flows into the space 72a. The oxygen gas flowing into the space 72a falls along the surfaces of the water-bearing layers 65a and 65b to be supplied to the space 71b through the ventilation path 58.

Hydrogen ions are transferred through the solid-state electrolytic element 70 by electrolytic reaction of the solid-state electrolytic element 70 to react with oxygen on the cathode surface to generate steam. However, part of a hydrogen ions whose amount is small does not react with oxygen and is turned to a hydrogen gas, and the hydrogen gas is discharged into the space 71b to be reserved at the top portion of the space 71b. The hydrogen gas is brought into contact with the rare-metal catalyst layer 76 arranged at the top portion of the space 71b to be converted into water.

In this manner, according to Embodiment 4, since the basic arrangement is constituted in the same manner as in Embodiment 2, the same effect as in Embodiment 2 can be obtained.

Since the solid-state electrolytic element 70 is shaped into a corrugate shape, a large electrolysis surface can be obtained in a small space, and cooling efficiency can be improved. The cooling apparatus can be made compact.

The spaces 71a and 72a are vertically arranged, the heat-radiator 74 is arranged in the upper space 71a, and the water-bearing layers 65a and 65b are arranged in the lower space 72a. For this reason, when an outer temperature is low, power supply to the solid-state electrolytic element 70 is stopped to function as a heat pipe, thereby cooling the target object 30. Therefore, power consumption can be reduced. When the outer temperature is high, the heat-radiator 74 functions as a condenser to cool an oxygen gas flowing from the space 71a into the space 72a, and cooling efficiency can be improved.

Here, although a description is omitted, a driving control means for the DC power supply 52 can be constituted by, e.g., a sensor for detecting an outer temperature and a control unit for ON/OFF-controlling the DC power supply 52 on the basis of a detection signal from the sensor.

The bottom portions of the spaces 71b and 72a communicate with each other through the water path 57 to reserve the water 53 in the bottom portion of the space 72a. For this reason, a water-sealing structure is formed between the spaces 71b and 72a, and the spaces 71b and 72a are different in pressure. By this pressure difference, the oxygen gas having a large specific weight can be sent to the space 71b positioned at a high level without a driving force.

The oxygen gas flowing from the space 71a into the space 72a through the communication hole 73 falls along the surfaces of the water-bearing layers 65a and 65b to form a low-humidity environment on the surfaces of the water-bearing layers 65a and 65b. Therefore, evaporation of water from the water-bearing layers 65a and 65b is accelerated.

The rare metal catalyst layer 76 is arranged at the top portion of the space 71b. A platinum-group element constituting the rare metal catalyst layer 76 has a catalytic effect with respect to hydrogen or hydrogen carbide to react the hydrogen or hydrogen carbide with an equivalent amount of oxygen and to decompose the hydrogen or hydrogen carbide at a low temperature. Since the interior of the space 71b is set in an oxygen gas atmosphere, when a hydrogen gas is accumulated, the hydrogen gas reacts with oxygen to set a dangerous state. However, the hydrogen gas discharged into the space 71b is converted into water by the rare-metal catalyst layer 76 within a short time to be consumed, thereby assuring safety.

Since the rare metal catalyst layer 76 has a ventilation structure, the hydrogen gas can be brought into countercurrent contact with an oxygen gas sent from the space 71a through the ventilation path 58. Decomposition reaction of the hydrogen gas can be enhanced to prevent the hydrogen gas from being reserved, and safety can be more improved.

In Embodiment 4, although the rare-metal catalyst layer 76 is simply arranged at the top portion of the space 71b, a micro-heater may be buried in the rare-metal catalyst layer 76 to heat the rare-metal catalyst layer 76 to an approximate temperature and to keep the rare-metal catalyst layer 76 in this state. In this case, decomposition reaction of the hydrogen gas is enhanced, and the hydrogen gas can be rapidly consumed.

Embodiment 5

Figure 8:
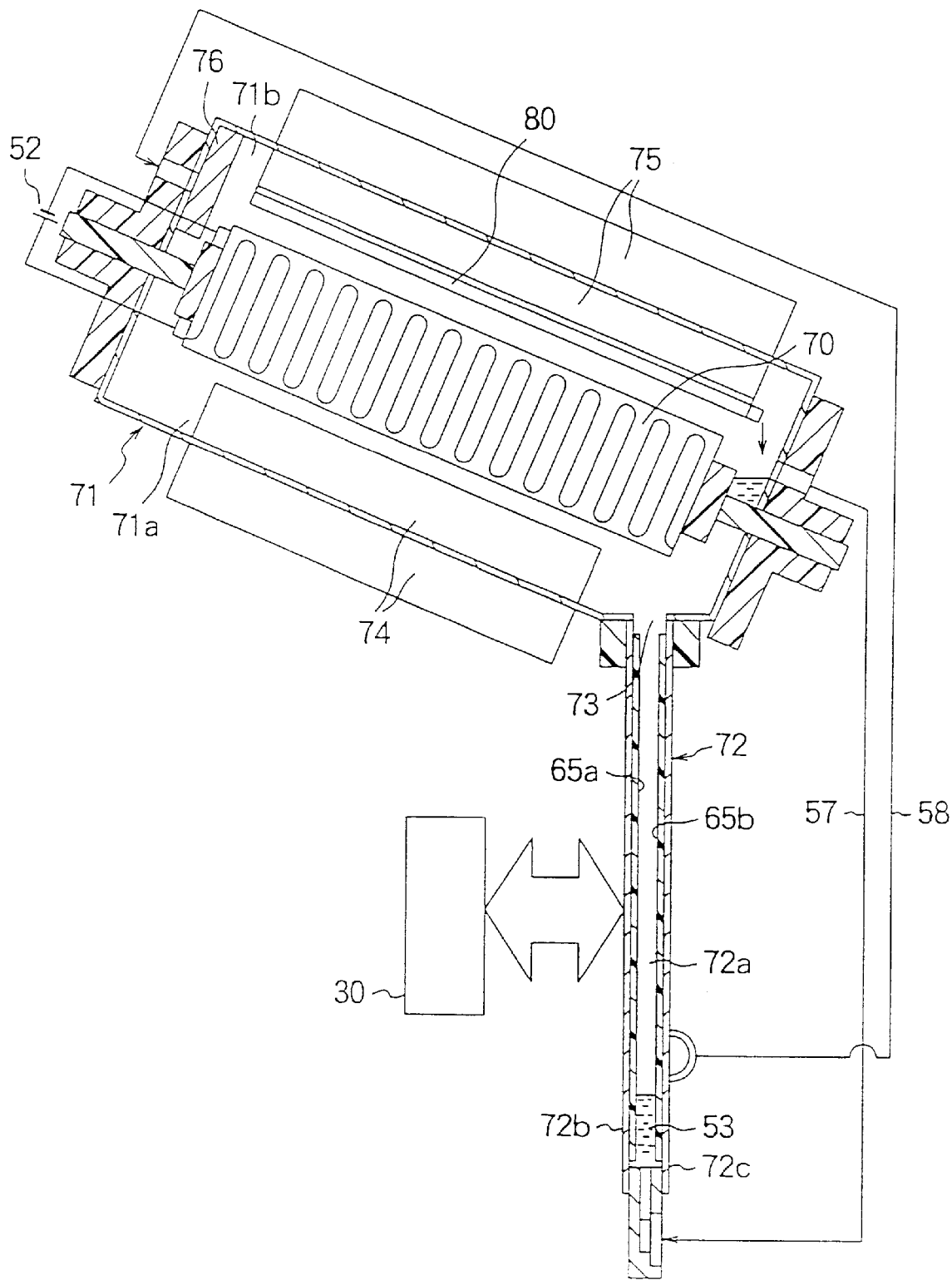
FIG. 8 is a view showing the typical arrangement of a water-evaporation type cooling apparatus based on electrolytic reaction according to Embodiment 5 of the present invention.

In Embodiment 4, the spaces 71a and 72a are linearly vertically arranged. However, in Embodiment 5, as shown in FIG. 8, an airtight can 72 is kept in a vertical direction, an airtight can 71 is horizontally or obliquely arranged to incline the parts around the solid-state electrolytic element 70 with respect to the cooling section, and a water-receiving pan 80 is placed to receive water condensed by a heat-radiator 75. In this case, the water condensed by the heat-radiator 75 is received by the water-receiving pan 80 to rapidly flow into the bottom portion of a space 71b, and the water is sent back to the bottom portion of a space 72a through a water path 57.

Embodiment 6

Figure 9:
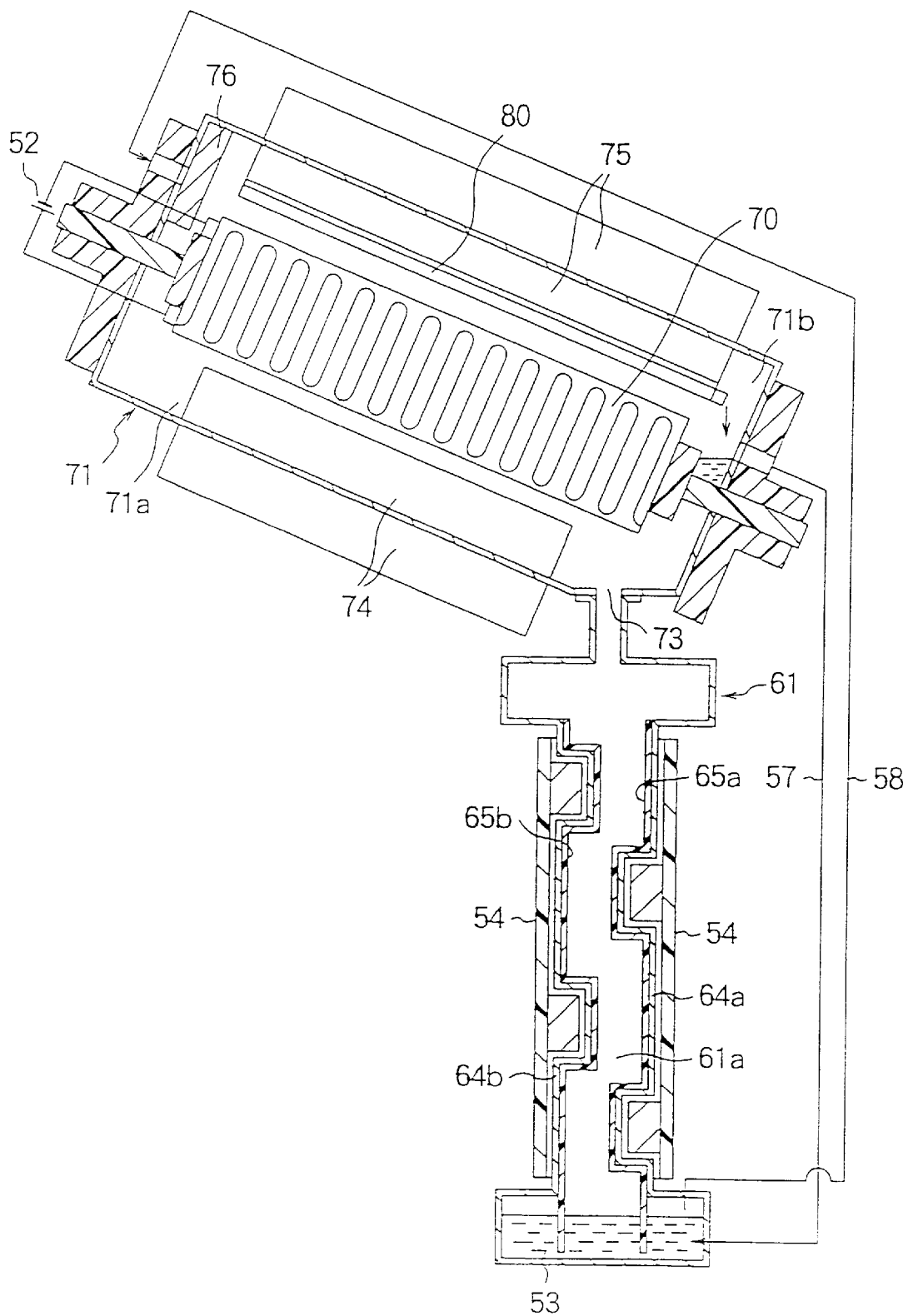
FIG. 9 is a view showing the typical arrangement of a water-evaporation type cooling apparatus based on electrolytic reaction according to Embodiment 6 of the present invention.

In Embodiment 6, as shown in FIG. 9, the airtight can 61 in Embodiment 2 is arranged in place of the airtight can 72 in Embodiment 5.

In this case, an effect obtained by combining the effects obtained in Embodiments 2 and 5 can be obtained.

Embodiment 7

Figure 10:
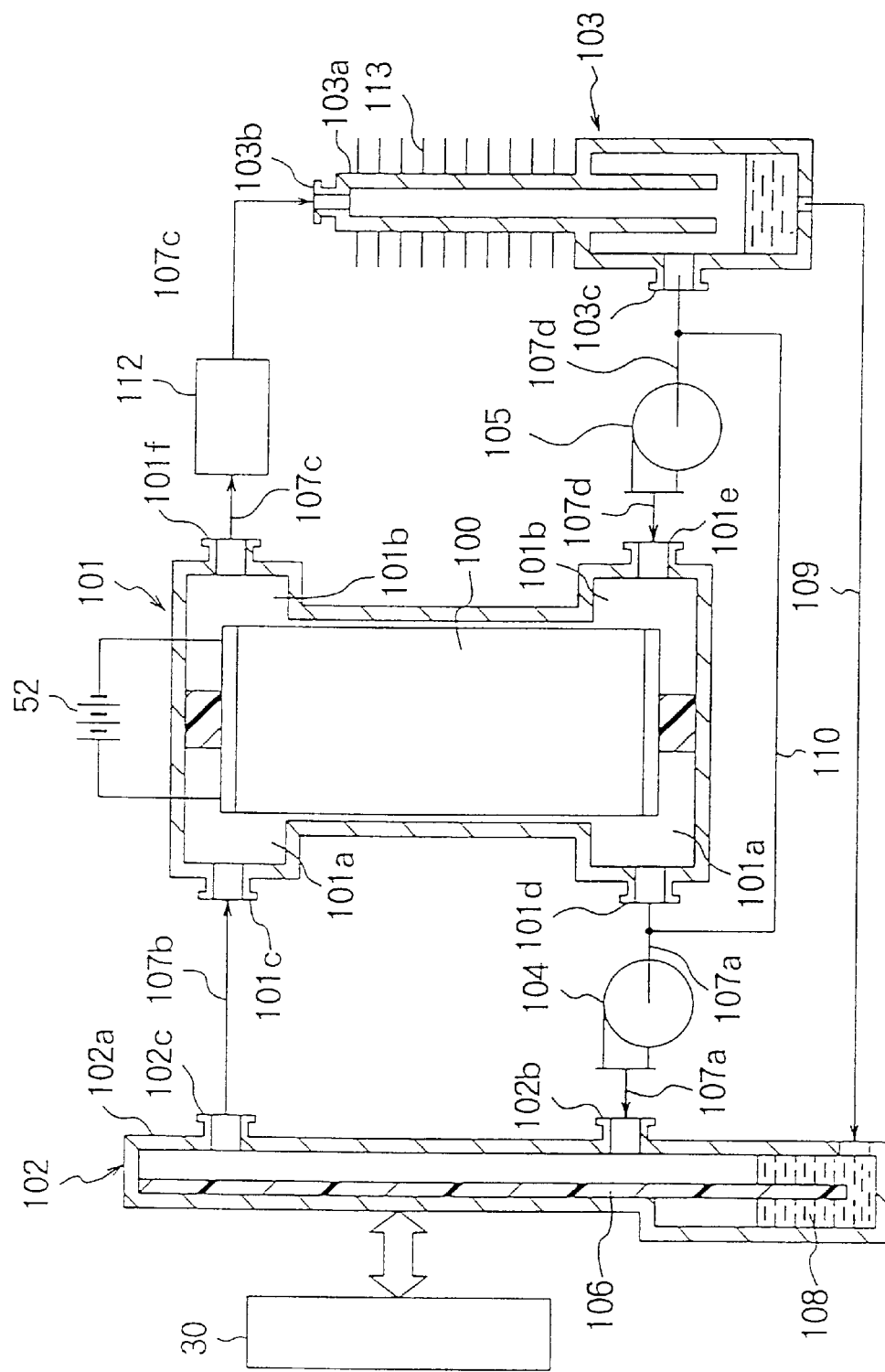
FIG. 10 is a view showing the system arrangement of a water-evaporation type cooling apparatus based on electrolytic reaction according to Embodiment 7 of the present invention.
Figure 11:
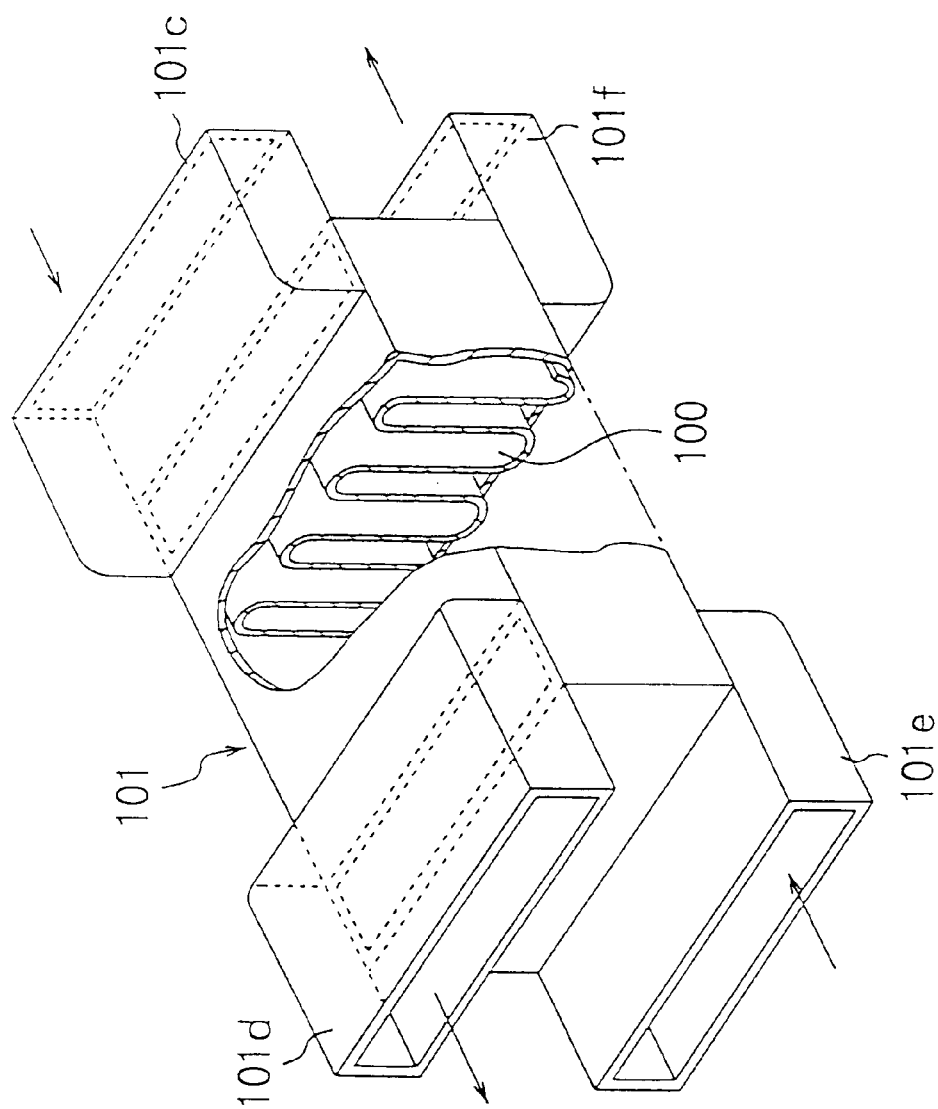
FIG. 11 is a view showing the stereoscopic arrangement of a solid-state polymer electrolytic module in the water-evaporation type cooling apparatus based on electrolytic reaction according to Embodiment 7 of the present invention.

FIG. 10 is a view showing the system arrangement of a water-evaporation type cooling apparatus based on electrolytic reaction according to Embodiment 7 of the present invention, and FIG. 11 is a view showing the stereoscopic arrangement of a solid high polymer electrolytic module in the water-evaporation type cooling apparatus based on electrolytic reaction according to Embodiment 7 of the present invention.

Figure 7:
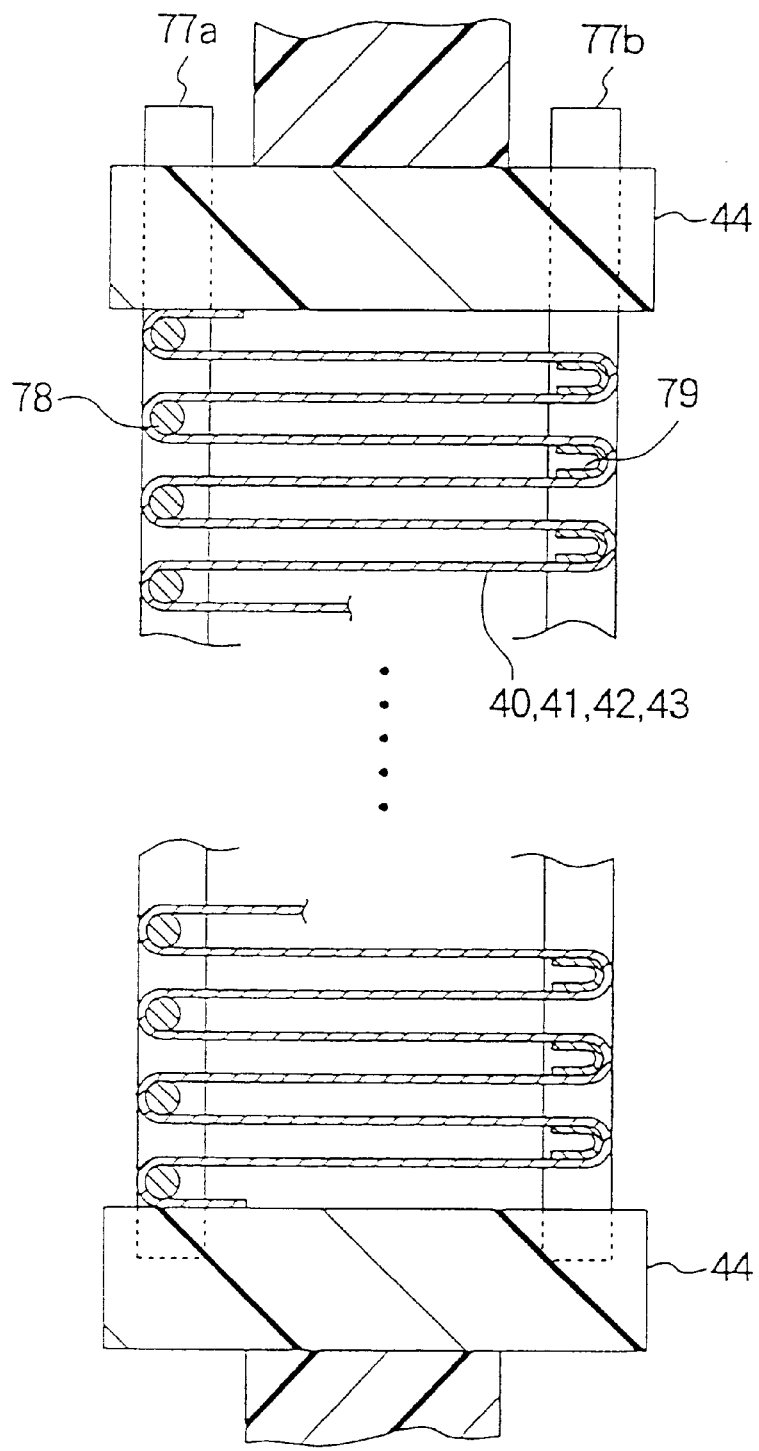
FIG. 7 is a sectional view showing the typical arrangement of a main part of a solid-state electrolytic element used in the water-evaporation type cooling apparatus based on electrolytic reaction according to Embodiment 4 of the present invention.

Referring to FIGS. 10 and 11, a solid high polymer electrolytic membrane having a cathode and an anode formed on both the surfaces thereof is shaped into a corrugate shape, and a solid-state electrolytic element 100 is constituted in the same manner as that of the solid-state electrolytic element 70 shown in FIG. 7. The solid-state electrolytic element 100 is stored in a housing 101 to partition the interior of the housing 101 into an anode-side space 101a and a cathode-side space 101b. In the housing 101, an anode-side inlet port 101c for causing a gas to flow into the anode-side space 101a, an anode-side exhaust port 101d for exhausting a gas from the anode-side space 101a, a cathode-side inlet port 101e for causing a gas to flow into the cathode-side space 101b, and a cathode-side exhaust port 101f for exhausting a gas from the cathode-side space 101b are arranged.

Here, the solid-state electrolytic element 100 is stored in the housing 101 such that the direction of peaks of the wave (troughs of the wave) of the solid high polymer electrolytic membrane shaped into a corrugate shape coincides with the flow direction of the fluid.

A evaporator 102 is constituted as follows. That is, a water-bearing layer 106 consisting of a porous plate, a mesh-like plate, and a film-like plate which have good heat conductivity and water-absorbing properties is formed on the inner wall surface of an airtight can 102a, and the lower end of the water-bearing layer 106 is dipped in water 108 reserved in the bottom portion of the airtight can 102a. The outer wall surface of the airtight can 102a at a portion where the water-bearing layer 106 is formed is thermally connected to the target object 30, and the evaporator 102 functions to absorb heat from the target object 30 and then evaporate moisture from the water-bearing layer 106. The evaporator 102 has an inlet port 102b and an exhaust port 102c which are connected to the anode-side exhaust port 101d and the anode-side inlet port 101c of the housing 101 through pipes 107a and 107b, respectively. A blower 104 is arranged in a path of the pipe 107a, so that a gas filled in the anode-side space 101a of the housing 101 and the evaporator 102 can be forcibly circulated by the blower 104.

On the other hand, a condenser 103 is constituted by forming a heat-radiation fin 113 on the outer wall surface of an airtight can 103a to cause heat of a gas flowing in the condenser 103 to be radiated out of the condenser 103 through the heat-radiation fin 113. The condenser 103 functions to condense steam contained in the gas and to drop condensed water. The condenser 103 has an inlet port 103b and an exhaust port 103c which are connected to the cathode-side exhaust port 101f and the cathode-side inlet port 101e of the housing 101 through pipes 107c and 107d, respectively. A blower 105 is arranged in a path of the pipe 107d, and a gas filled in the cathode-side space 101b of the housing 101 and the condenser 103 can be forcibly circulated by the blower 105.

Here, the anode-side circulation path is constituted by the anode-side space 101a, the pipe 107a, the evaporator 102, and the pipe 107b, and the cathode-side circulation path is constituted by the cathode-side space 101b, the pipe 107c, the condenser 103, and the pipe 107d.

The bottom portion of the evaporator 102 and the bottom portion of the condenser 103 communicate with each other through a communication pipe 109. The intake sides of the blowers 104 and 105 communicate with each other through an equalizing pipe 110. A platinum-group catalyst layer 112 is arranged at a portion of the cathode-side circulation path, e.g., in the path of the pipe 107c. The platinum-group catalyst layer 112 consists of a platinum, ruthenium, or palladium fine powder or a material obtained by carrying the above metal on the surface of a granular structure, a pellet, or a honeycomb structure obtained by shaping a metal oxide such as ferrite or titanium oxide. The structure in the layer can be ventilated. A DC voltage can be applied from the DC power supply 52 to the solid-state electrolytic element 100.

Oxygen or oxygen-enriched air is used as a gas flowing in the anode-side circulation path and the cathode-side circulation path to remove an inert gas which is not related to electrolytic reaction.

An operation of the water-evaporation type cooling apparatus according to Embodiment 7 will be described below.

The blower 104 sends a low-humidity gas in the anode-side space 101a from the bottom portion of the anode-side space 101a into the evaporator 102 through the anode-side exhaust port 101d, the pipe 107a, and the inlet port 102b.

The sent low-humidity gas is forcibly raised along the water-bearing layer 106 formed on the inner wall surface of the airtight can 102a to constitute a forcible air current along the water-bearing layer 106. By the forcible air current, evaporation of moisture from the surface of the water-bearing layer 106 is accelerated to make the humidity of the gas high. The high-humidity gas is sent from the top portion of the evaporator 102 into the anode-side space 101a through the exhaust port 102c, the pipe 107b, and the anode-side inlet port 101c. The high-humidity gas flows downward along the anode-side electrolysis surface of the solid-state electrolytic element 100, and is sent back to the intake side of the blower 104 to be circulated in the anode-side circulation path.

At this time, in the process in which the high-humidity gas flows downward along the anode-side electrolysis surface of the solid-state electrolytic element 100, electrolytic reaction of steam in the gas occurs at the anode of the solid-state electrolytic element 100 applied with a DC voltage to convert the steam into an oxygen gas. The gas flowing downward along the anode-side electrolysis surface of the solid-state electrolytic element 100 is reduced in humidity to have a low humidity.

When the forcible air current flows along the surface of the water-bearing layer 106, the temperature of the water-bearing layer 106 decreases to the wet bulb temperature of the gas, and the wall surface of the airtight can 102a on which the water-bearing layer 106 is formed is cooled. The target object 30 thermally connected to the airtight can 102a is cooled. At this time, the water-bearing layer 106 is dipped in the water 108 reserved in the bottom portion of the airtight can 102a. For this reason, when moisture is evaporated from the surface of the water-bearing layer 106, the water 108 is absorbed by the water-bearing layer 106 by capillarity, the water-bearing layer 106 is kept in a wetting state.

The blower 105 sends the gas in the cathode-side space 101b from the top portion of the cathode-side space 101b into the condenser 103 through the cathode-side exhaust port 101f, the pipe 107c, and the inlet port 103b. The gas sent into the condenser 103 is sent into the bottom portion of the cathode-side space 101b through the exhaust port 103c, the pipe 107d, and the cathode-side inlet port 101e. Thereafter, the gas sent into the bottom portion of the cathode-side space 101b flows upward along the cathode-side electrolysis surface of the solid-state electrolytic element 100 to be circulated in the cathode-side circulation path.

Here, in the process in which the gas flows upward along the cathode-side electrolysis surface of the solid-state electrolytic element 100, reaction between oxygen in the gas and hydrogen ions transmitted through the solid high polymer electrolytic membrane of the solid-state electrolytic element 100 occurs at the cathode of the solid-state electrolytic element 100 applied with a DC voltage to convert the oxygen into steam. For this reason, the gas flowing upward along the cathode-side electrolysis surface of the solid-state electrolytic element 100 is increased in humidity to have a high humidity. At the same time, the gas receives Joule heat generated by a current flowing in the solid-state electrolytic element 100 to have a high temperature and a high humidity, and the gas is sent to the condenser 103. At this time, although part of the hydrogen ions transmitted through the solid high polymer electrolytic membrane is mixed with the gas without being coupled to oxygen, when the hydrogen gas transmits through the platinum-group catalyst layer 112 arranged in the path of the pipe 107c, the hydrogen gas is decomposed by a catalyst function and subsequently removed. The high-temperature and high-humidity gas sent into the condenser 103 is cooled by radiating heat from the gas out of the apparatus through the heat-radiation fin 113, and steam is condensed to be dropped on the bottom portion of the airtight can 103a. The condensed water collected in the bottom portion of the airtight can 103a is sequentially sent back to the bottom portion of the evaporator 102 through the communication pipe 109, thereby assuring the amount of water 108 reserved in the bottom portion of the evaporator 102.

Oxygen generated on the anode-side electrolysis surface is sent back to the suction side of the blower 105 through the equalizing pipe 110.

In general, according to the electrolytic reaction theory or the heat-material transfer theory, electrolytic reaction and heat-material transfer can be performed at a speed ten and several times to several ten times that of the natural convection in a turbulent flow area, even in a laminar flow area, at a speed several times that of the natural convection. According to Embodiment 7, since the blowers 104 and 105 are arranged in the anode-side circulation path and the cathode-side circulation path, respectively, by the operation of the blowers 104 and 105, the air currents flowing through the evaporator 102, the condenser 103, and both the polar surfaces of the solid-state electrolytic element 100 can be made forcible air currents. Therefore, the electrolysis surface and the heat-material transfer surface can be held in a turbulent flow area or a laminar flow area, and the electrolysis and heat-material transfer can be performed at a high speed. As a result, the solid-state electrolytic element 100, the evaporator 102, and the condenser 103 can be made compact, and the apparatus can be reduced in size.

Since the solid-state electrolytic element 100 is constituted such that a solid high polymer electrolytic membrane having a cathode and an anode formed on both the surfaces thereof is shaped into a corrugate shape, a large electrolysis surface can be obtained in a small area, cooling efficiency can be improved, and the apparatus can be reduced in size.

In order to generate oxygen by consuming steam on the anode-side electrolysis surface, an amount of oxygen increases in the anode-side circulation path, and the anode-side circulation path increases in pressure. According to Embodiment 7, the suction sides of the blowers 104 and 105 communicate with each other through the equalizing pipe 110. For this reason, oxygen generation on the anode-side electrolysis surface is sent back to the suction side of the blower 105, i.e., into the cathode-side space 101b, through the equalizing pipe 110. The pressure in the anode-side space 101a can be suppressed from excessively increasing, and an oxygen-shortage state in the cathode-side space 101b can be avoided.

Since the platinum-group catalyst layer 112 is arranged in the path of the pipe 107c, hydrogen ions in the cathode-side circulation path can be decomposed and removed by the platinum-group catalyst layer 112. Therefore, an increase in concentration of a hydrogen gas caused by accumulating hydrogen ions mixed in the gas without being coupled with oxygen can be prevented, and an accident such as an explosion caused such that the concentration of the hydrogen gas exceeds a value falling within the safety allowance range can be prevented from occurring.

Oxygen or oxygen-enriched air is used as a gas flowing in the anode-side circulation path and the cathode-side circulation path to remove an inert gas which is not related to electrolytic reaction. For this reason, the electrolytic reaction can be increased in speed, and the solid-state electrolytic element 100 can be reduced in scale.

The gas flowing in the anode-side circulation path and the cathode-side circulation path ideally consists of a twocomponent gas which consisting of oxygen and steam which are related to electrolytic reaction and free from a gas which is not related to electrolytic reaction, e.g., a nitrogen gas or the like. At this time, since the oxygen gas is a burning-assistant gas, and a flammable environment is made, flammability or material selection must be sufficiently considered. When flammability is considered, or limitation by material selection is avoided, air or a gas whose oxygen concentration is increased within an allowance range may be circulated.

In Embodiment 7, the blowers 104 and 105 are arranged in the anode-side circulation path and the cathode-side circulation path, respectively, to forcibly circulate the gas in both the circulation paths, thereby obtaining an excellent effect. However, a blower may be arranged in any one of the anode-side circulation path and the cathode-side circulation path. In this case, the effect can be obtained by forcibly circulating a gas in one circulation path.

Embodiment 8

Figure 12:
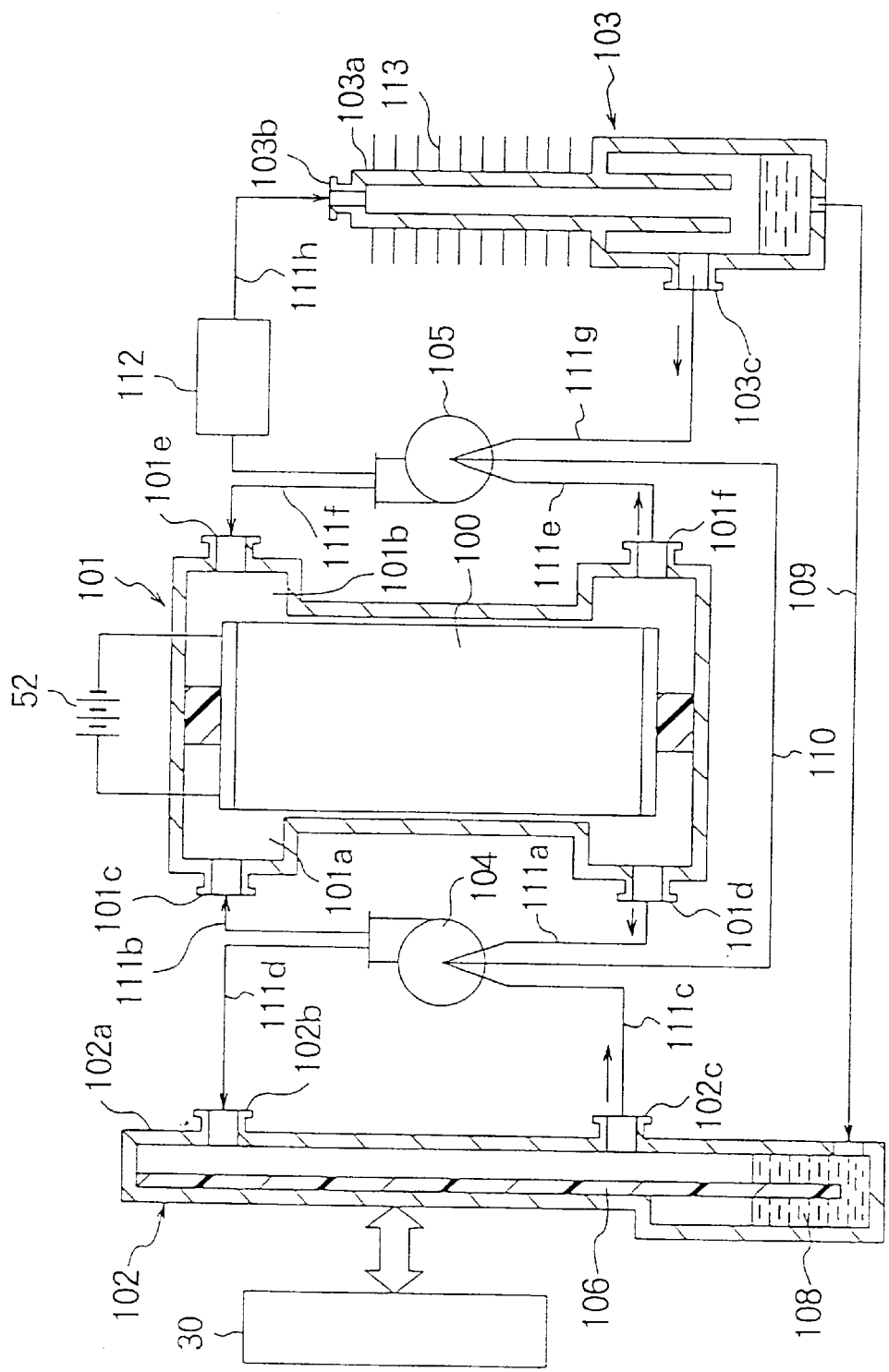
FIG. 12 is a view showing the system arrangement of a water-evaporation type cooling apparatus based on electrolytic reaction according to Embodiment 8 of the present invention.

FIG. 12 is a view showing the system arrangement of a water-evaporation type cooling apparatus based on electrolytic reaction according to Embodiment 8 of the present invention.

According to Embodiment 8, an anode-side exhaust port 101$d$ of a housing 101 and an exhaust port 102$c$ of evaporator 102 are connected to the suction side of a blower 104 through pipes 111$a$ and 111$c$, respectively, and an anode-side inlet port 101$c$ of the housing 101 and an in-let port 102$b$ of the evaporator 102 are connected to the exhaust side of the blower 104 through pipes 111$b$ and hid, respectively. Similarly, a cathode-side exhaust port 101$f$ of the housing 101 and an exhaust port 103$c$ of a condenser 103 are connected to a blower 105 through pipes 111$e$ and 111$g$, respectively, and a cathode-side inlet port 101$e$ of the housing 101 and an inlet port 103$b$ of the condenser 103 are connected to the exhaust side of the blower 105 through pipes 111$f$ and 111$h$, respectively. The intake sides of the blowers 104 and 105 communicates with each other through an equalizing pipe 110. A platinum-group catalyst layer 112 is arranged in the path of the pipe 111$h$.

Here, the anode-side circulation path is constituted by a first anode-side circulation path constituted by the anode-side space 101$a$ and the pipes 111$a$ and 111$b$ and a second anode-side circulation path constituted by the evaporator 102 and the pipes 111$c$ and 111$d$. The cathode-side circulation path is constituted by a first cathode-side circulation path constituted by a cathode-side space 101$b$ and the pipes 111$e$ and 111$f$ and a second cathode-side circulation path constituted by the condenser 103 and the pipes 111$g$ and 111$h$. The ratio of cross-sectional areas of the pipe 111$b$ and 111$d$ are set to be 4:1, and the ratio of cross-sectional areas of the pipe 111$f$ and 111$h$ are set to be 4:1. Note that the other arrangement is the same as that in Embodiment 7.

A characteristic operation of the water-evaporation type cooling apparatus according to Embodiment 8 will be described below.

A gas in the anode-side space 101$a$ and a gas in the evaporator 102 are taken by the blower 104 through the pipes 111$a$ and 111$c$, respectively, to be mixed with each other, and the gas mixture is sent out of the apparatus. The gas sent from the blower 104 is divided through the pipes 111$b$ and 111$d$ at a ratio of 4:1, and the divided gases flow into the anode-side space 101$a$ and the evaporator 102. The gas flowing from the anode-side inlet port 101$c$ into the anode-side space 101$a$ flows along the anode-side electrolysis surface of a solid-state electrolytic element 100, and is reduced in humidity such that steam of the gas is converted into an oxygen gas. Thereafter, the gas reduced in humidity is sent back from the anode-side exhaust port 101$d$ to the intake side of the blower 104 through the pipe 111$a$. The gas flowing from the inlet port 102$b$ into the evaporator 102 flows along a water-bearing layer 106, and is increased in humidity such that the gas absorbs steam evaporated from the surface of the water-bearing layer 106. Thereafter, the gas increased in humidity is sent back from the exhaust port 102$c$ to the intake side of the blower 104 through the pipe 111$c$, and is mixed with the gas reduced in humidity and sent back from the anode-side exhaust port 101$d$ to the intake side of the blower 104 through the pipe 111$a$.

A gas in the cathode-side space 101$b$ and a gas in the condenser 103 are taken by the blower 105 through the pipes 111$e$ and 111$g$, respectively, and mixed with each other, and the gas mixture is sent out of the apparatus. The gas sent from the blower 105 is divided through the pipes 111$f$ and 111$h$ at a ratio of 4:1, and the divided gases flow into the cathode-side space 101$b$ and the condenser 103. At this time, when the gas flowing into the pipe 111$h$ passes through the platinum-group catalyst layer 112, the gas flows into the condenser 103 such that a hydrogen gas in the gas is removed by a catalyst function. The gas flowing from the cathode-side inlet port 101$e$ into the cathode-side space 101$b$ flows along the cathode-side electrolysis surface of the solid-state electrolytic element 100, and is increased in humidity such that oxygen contained in the gas reacts with hydrogen ions transmitted through the solid high polymer electrolytic membrane to be converted into steam. The gas is heated by Joule heat from the solid-state electrolytic element 100. Thereafter, the gas increased in humidity and heated is sent back from the cathode-side exhaust port 101$f$ to the intake side of the blower 105 through the pipe 111$e$. The gas flowing from the inlet port 103$b$ into the condenser 103 is cooled such that heat of the gas is radiated out of the apparatus through the heat-radiation fin 113, and steam is condensed to decrease humidity. Thereafter, the gas reduced in humidity and cooled is sent back from the exhaust port 103$c$ to the intake side of the blower 105 through the pipe 111$g$, and is mixed with the gas heated, increased in humidity, and sent back from the cathode-side exhaust port 101$f$ to the intake side of the blower 105 through the pipe 111$e$.

Condensed water condensed by the condenser 103 and collected in the bottom portion of the airtight can 103$a$ is sequentially sent back to the bottom portion of the evaporator 102 through a communication pipe 109, thereby assuring the amount of water 108 reserved in the bottom portion of the evaporator 102. Oxygen generated on the anode-side electrolysis surface is sent back to the suction side of the blower 105 through the equalizing pipe 110.

As described above, according to Embodiment 8, the blowers 104 and 105 are arranged in the anode-side circulation path and the cathode-side circulation path, respectively, to forcibly circulate the gas in both the circulation paths. For this reason, as in Embodiment 7, an electrolysis surface and heat-material transfer surface can be held in a turbulent flow area or a laminar flow area, and the electrolytic reaction and heat-material transfer can be performed at a high speed.

The anode-side circulation path is constituted by the first anode-side circulation path constituted by the anode-side space 1014$a$ and the pipes 111$a$ and 111$b$ and the second anode-side circulation path constituted by the evaporator 102 and the pipes 111$c$ and 111$d$, and the ratio of cross-sectional areas of the pipe 111$b$ and 111$d$ are set to be 4:1. For this reason, the flow rate of a gas flowing from the blower 104 into the evaporator 102 is limited to about 20% the total flow rate. Therefore, heat transferred to the evaporator 102 is reduced, an increase in temperature of the water-bearing layer 106 is suppressed, and the cooling efficiency of a target object 30 can be improved.

The cathode-side circulation path is constituted by the first cathode-side circulation path constituted by a cathode-side space 101*b* and the pipes file and 111*f* and a second cathode-side circulation path constituted by the condenser 103 and the pipes 111*g* and 111*h*, and the ratio of cross-sectional areas of the pipe 111*f* and 111*h* are set to be 4:1. For this reason, the flow rate of a gas flowing from the blower 105 into the condenser 103 is limited to about 20% the total flow rate. Therefore, almost all the gas circulated in the cathode-side circulation path is circulated in the first cathode-side circulation path, the gas is heated by Joule heat generated by a current flowing in the solid-state electrolytic element 100, and the gas receives steam generated by electrolysis to be increased in humidity. As a result, the gas flowing into the condenser 103 can be made a gas having a temperature equal to or higher than the outer temperature and a humidity increased to about a saturation point. Therefore, even if the condenser 103 has an air-cooling system, the gas flowing into the condenser 103 is kept at a temperature equal to or higher A than the outer temperature. For this reason, the gas is cooled to a temperature equal to or lower than the dew point by radiating heat from the gas out of the apparatus, and steam is condensed, so that steam generated in the cathode-side space 101*b* can be sequentially extracted as condensed water.

Since the platinum-group catalyst layer 112 is arranged in the path of the pipe 111*h* in which the flow rate of a gas is limited to a specific rate, the flow rate load of the catalyst layer can be reduced, and the platinum-group catalyst layer 112 can be reduced in size.

In Embodiment 8, although the ratio of cross-sectional areas of the pipe 111*b* and the pipe 111*d* is set to be 4:1, the ratio of cross-sectional areas is not limited to 4:1, the total flow rate of the gas circulated in the anode-side circulation path may be partially separated to the evaporator 102 side. For example the ratio of cross-sectional areas may be set to be 5:1. Although the ratio of cross-sectional areas of the pipe 111*f* and the pipe 111*h* is set to be 4:1, this ratio of cross-sectional areas is not limited to 4:1 as in the above case.

In Embodiment 8, although the gas flow rate ratio of both the surfaces is regulated by the ratio of cross-sectional areas of both the pipes, a diaphragm or partition may be arranged on the exhaust side of a blower to regulate the flow rate ratio of gases flowing into both the pipes.

Embodiment 9

Figure 13:
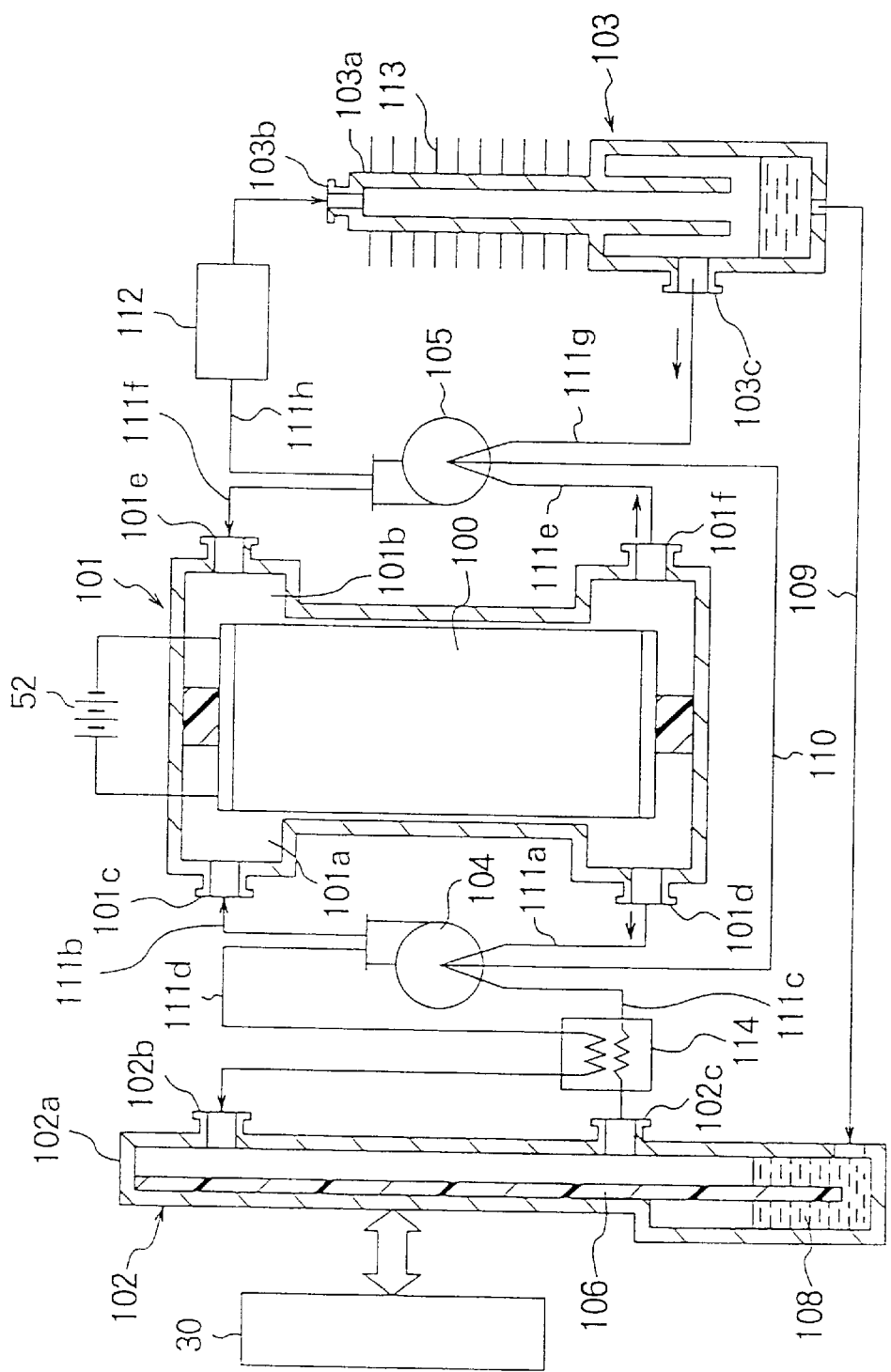
FIG. 13 is a view showing the system arrangement of a water-evaporation type cooling apparatus based on electrolytic reaction according to Embodiment 9 of the present invention.

In Embodiment 9, as shown in FIG. 13, a heat exchanger 114 is arranged in a second anode-side circulation path, so that a heat exchange between gases circulated in pipes 111*c* and 111*d* is performed.

The other arrangement is the same as that in Embodiment 8.

According to Embodiment 9, the gas circulated in the pipe 111*d* is cooled such that a heat exchange between the gas and a gas circulated in the pipe 111*c* and cooled by an evaporator 102 is performed by the heat exchanger 114, and then flows into the evaporator 102. Heat transferred to the evaporator 102 is further reduced, the temperature of a water-bearing layer 106 can be lowered by the reduction in heat, and the cooling efficiency of a target object 30 can be improved.

Embodiment 10

Figure 14:
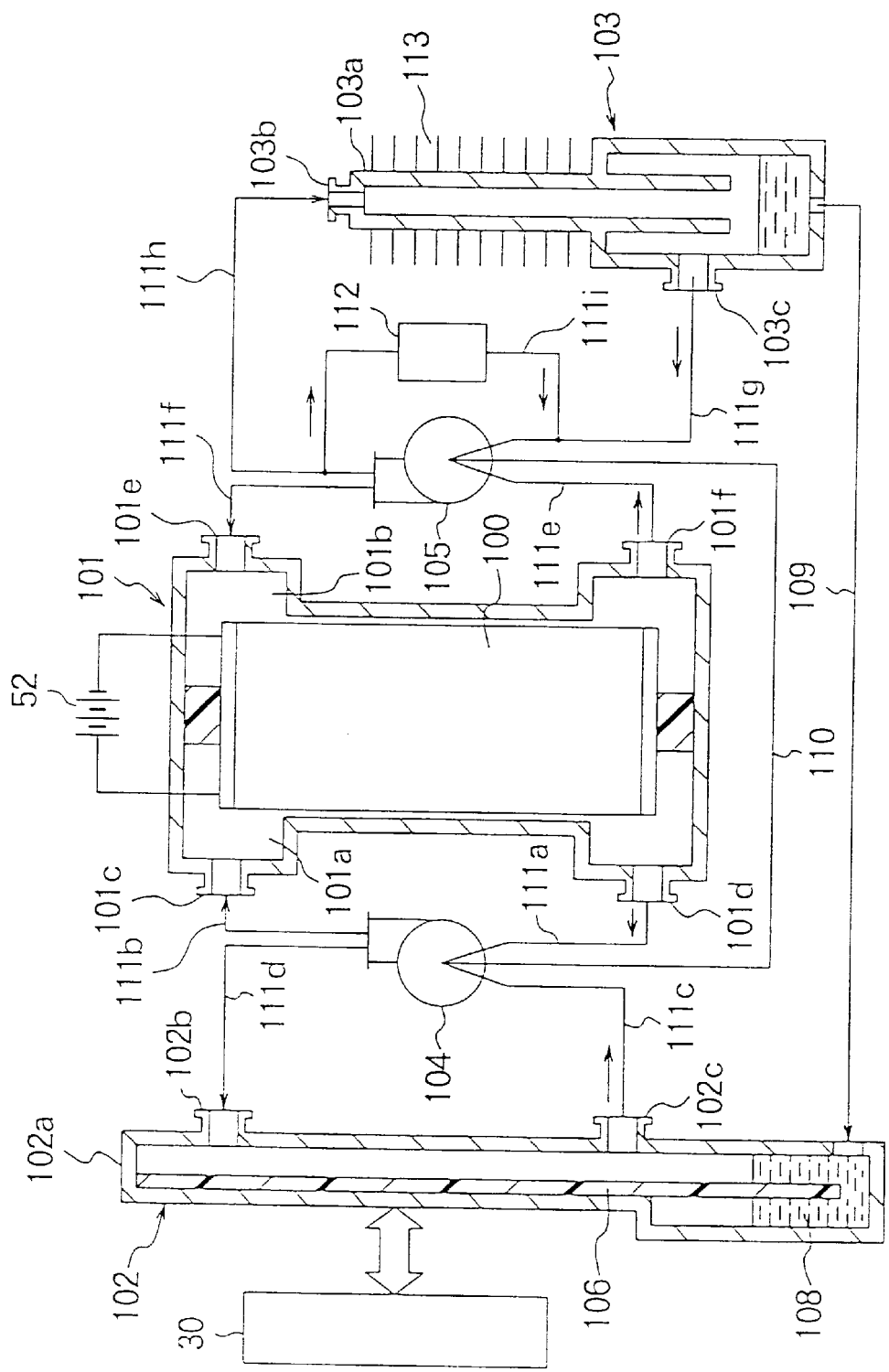
FIG. 14 is a view showing the system arrangement of a water-evaporation type cooling apparatus based on electrolytic reaction according to Embodiment 10 of the present invention.

In Embodiment 10, as shown in FIG. 14, the intake side of a blower 105 in a pipe 111*g* communicates with the exhaust side of the blower 105 in a pipe 111*h* through a pipe 111*i*, and a platinum-group catalyst layer 112 is arranged in the path of the pipe 111*i*.

The other arrangement is the same as that in Embodiment 8.

According to Embodiment 10, since the pipe 111*i* is branched from the pipe 111*h*, the flow rate of a gas circulated in the pipe 111*i* is becomes smaller with respect to the total flow rate of the gas circulated in the cathode-side circulation path. The flow rate load of the catalyst layer can be reduced by a reduction in rate of the gas, and the platinum-group catalyst layer 112 can be reduced in size.

In Embodiments 7 to 10, although the case wherein a condenser 103 has an air-cooling system is described, the condenser 103 may be cooled by a cooling medium having a low temperature. In this case, the temperature of a gas flowing into the condenser 103 is higher than a cooling medium temperature, heat-radiation speed can be increased, and steam generated in a cathode-side space 101*b* can be efficiently extracted as condensed water.

Embodiment 11

Figure 15:
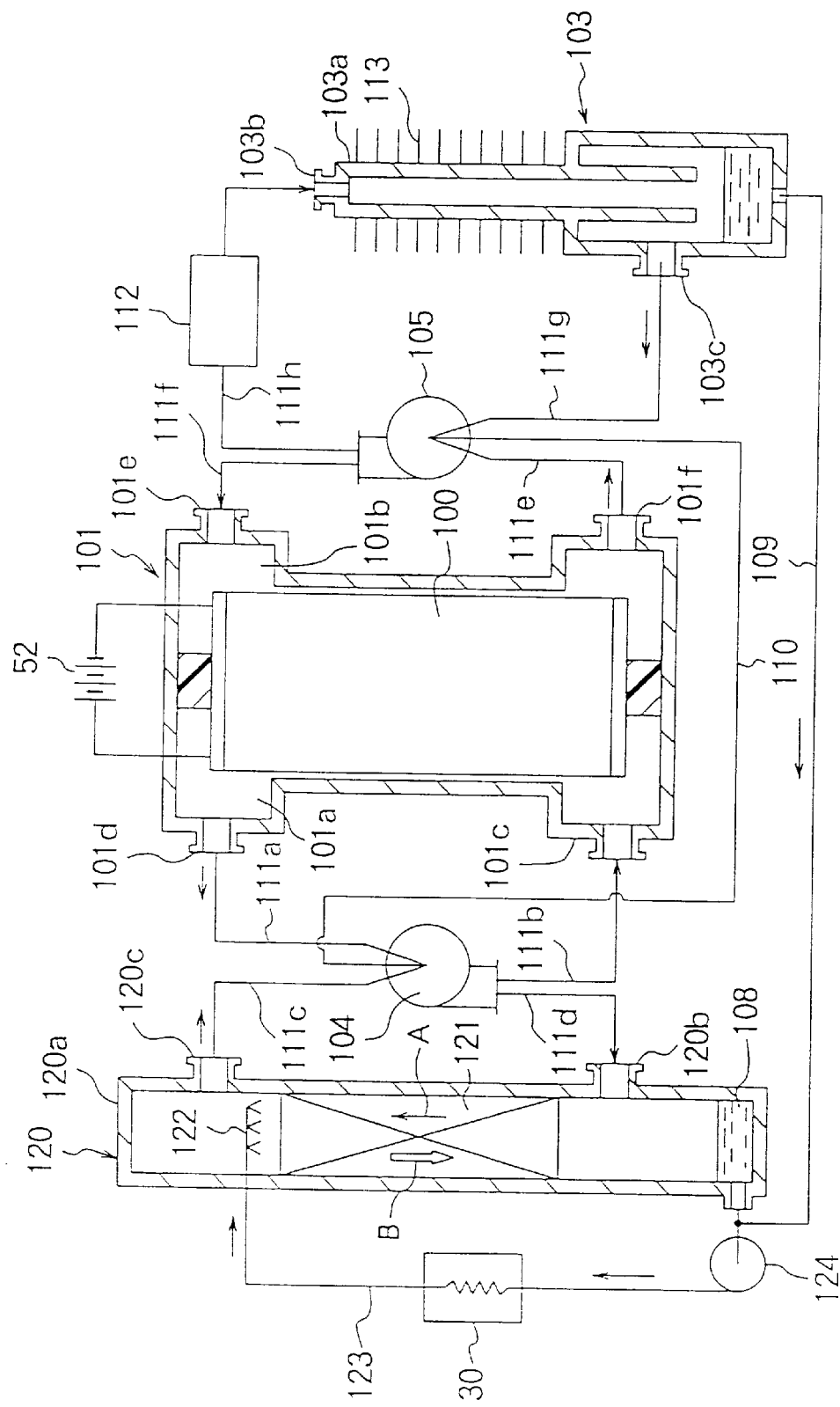
FIG. 15 is a view showing the system arrangement of a water-evaporation type cooling apparatus based on electrolytic reaction according to Embodiment 11 of the present invention.

FIG. 15 is a view showing the system arrangement of a water-evaporation type cooling apparatus based on electrolytic reaction according to Embodiment 11 of the present invention.

According to Embodiment 11, an anode-side exhaust port 101*d* of a housing 101 and an exhaust port 120*c* of a gas-liquid contactor 120 are connected to the intake side of a blower 104 through pipes 111*a* and 111*c*, respectively, and an anode-side inlet port 101*c* of the housing 101 and an inlet port 120*b* of the gas-liquid contactor 120 are connected to the exhaust side of the blower 104 through pipes 111*b* and 111*d*, respectively. The intake sides of the blower 104 and a blower 105 communicates with each other through an equalizing pipe 110.

The gas-liquid contactor 120 is constituted in the following manner. That is, a filing material represented by a Raschig ring is filled in a cylindrical can member 120*a* to vertically divide the interior of the can member 120*a* to form a filling layer 121, the exhaust port 120*c* is formed to communicate with the upper space of the can member 120*a* divided by the filling layer 121, and an inlet port 120*b* is formed to communicate with the lower space of the can member 120*a*. Further, water 108 is reserved in the bottom portion of the gas-liquid contactor 120. A water spray unit 122 is arranged in the upper space of the can member 120*a* divided by the filling layer 121. The water spray unit 122 communicates with the bottom portion of the can member 120*a* through a pipe 123, and the water 108 reserved in the bottom portion of the can member 120*a* is supplied to the water spray unit 122 by a circulation-water pump 124 arranged in the path of the pipe 123. The pipe 123 is thermally connected to a target object 30.

Here, the anode-side circulation path is constituted by a first anode-side circulation path constituted by an anode-side space 101*a* and the pipes 111*a* and 111*b* and a second anode-side circulation path constituted by the gas-liquid contactor 120 and the pipes 111*c* and 111*d*. On the other hand, the cathode-side circulation path is constituted by a first cathode-side circulation path constituted by a cathode-side space 101*b* and pipes 111*e* and 111*f* and a second cathode-side circulation path constituted by the condenser 103 and pipes 111*g* and 111*h*. The other arrangement is the same as that in Embodiment 8.

A characteristic feature of the water-evaporation steam type cooling apparatus according to Embodiment 11.

A gas in the anode-side space 101*a* and a gas in the gas-liquid contactor 120 are taken by the blower 104 through the pipes 111a and 111c, respectively, to be mixed with each other, and the gas mixture is sent out of the apparatus. The gas sent from the blower 104 is divided through the pipes 111b and 111d, and the divided gases flow into the anode-side space 101a and the gas-liquid contactor 120. The gas flowing from the anode-side inlet port 101c into the anode-side space 101a flows along the anode-side electrolysis surface of a solid-state electrolytic element 100, and is reduced in humidity such that steam of the gas is converted into an oxygen gas. Thereafter, the gas reduced in humidity is sent back from the anode-side exhaust port 101d to the intake side of the blower 104 through the pipe 111a.

A gas flowing from the inlet port 120b into the gas-liquid contactor 120 rises in the direction of arrow A through the filling layer 121. At this time, the circulation-water pump 124 is driven, the water 108 reserved in the bottom portion of the can member 120a is supplied to the water spray unit 122 through the pipe 123 to be uniformly sprayed to the filling layer 121. The gas flowing through the filling layer 121 in the direction of arrow A is brought into countercurrent contact with water falling in the direction of arrow B to evaporate water, thereby increasing a humidity. The gas increased in humidity is sent from the exhaust port 120c to the intake side of the blower 104 through the pipe 111c, and is mixed with a gas reduced in humidity and sent back from the anode-side exhaust port 101d to the intake side of the blower 104 through the pipe 111a. On the other hand, the water falling through the filling layer 121 is brought into countercurrent contact with a gas, and evaporation latent heat is removed from the water. The water decreases in temperature to be dropped in the bottom portion of the can member 120a.

Figure 16:
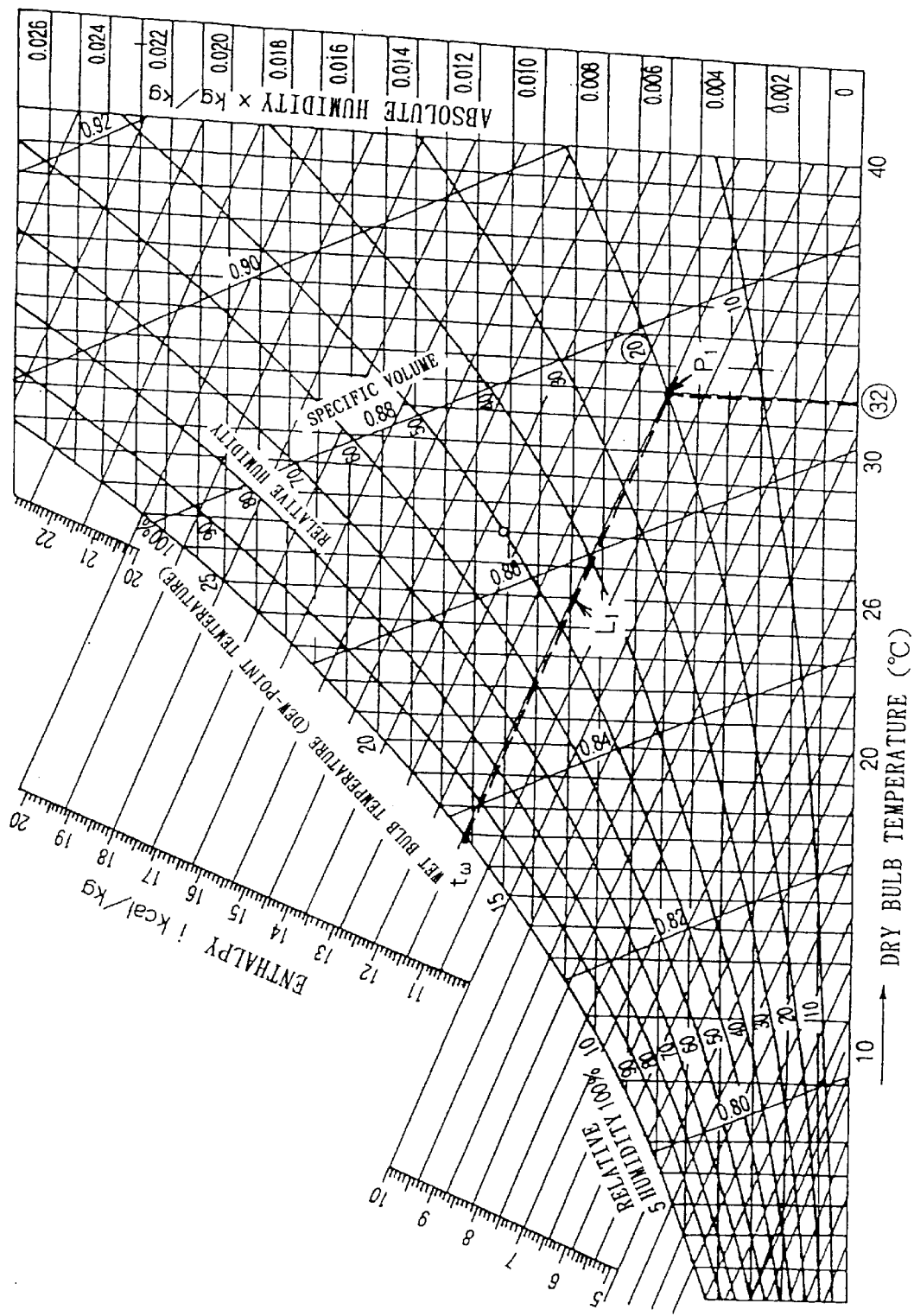
FIG. 16 is a view for explaining a cooling operation performed by the water-evaporation type cooling apparatus based on electrolytic reaction according to Embodiment 11 of the present invention.

Here, assume that the gas sent from the blower 104 has a temperature of 32° C. and a humidity of 20% (corresponding to a middle point $P_1$ in FIG. 16). In this case, the temperature of water which is in contact with the gas enthalpically changes along a straight line $L_1$ in FIG. 16, and decreases to a wet bulb temperature $T_w=17°$ C. Therefore, the water 108 reserved in the bottom portion of the can member 120a decreases in temperature. Water flowing in the pipe 123 has a low temperature, and the target object 30 is cooled to an outer temperature or less.

Oxygen generated on the anode-side electrolysis surface is sent back to the intake side of the blower 105 through the equalizing pipe 110. In addition, the condensed water collected in the bottom portion of the airtight can 103a is sequentially sent back to the water-supply side of the circulation-water pump 124 through a communication pipe 109.

According to Embodiment 11, low-temperature water can be easily obtained, and the target object 30 can be cooled by using the low-temperature water. Therefore, the application range of the cooling apparatus is widened, and application development can be enlarged.
Embodiment 12

According to Embodiment 11, the cooling apparatus uses a closed loop having the following structure. That is, the condenser 103 is arranged in the cathode-side circulation path, a high-temperature and high-humidity gas generated by the cathode-side space 101b is cooled by the condenser 103 to be recovered as condensed water, and the condensed water is sent back to the anode-side circulation path. According to Embodiment 12, a cooling apparatus is applied to a system to which water can be supplied.

Figure 17:
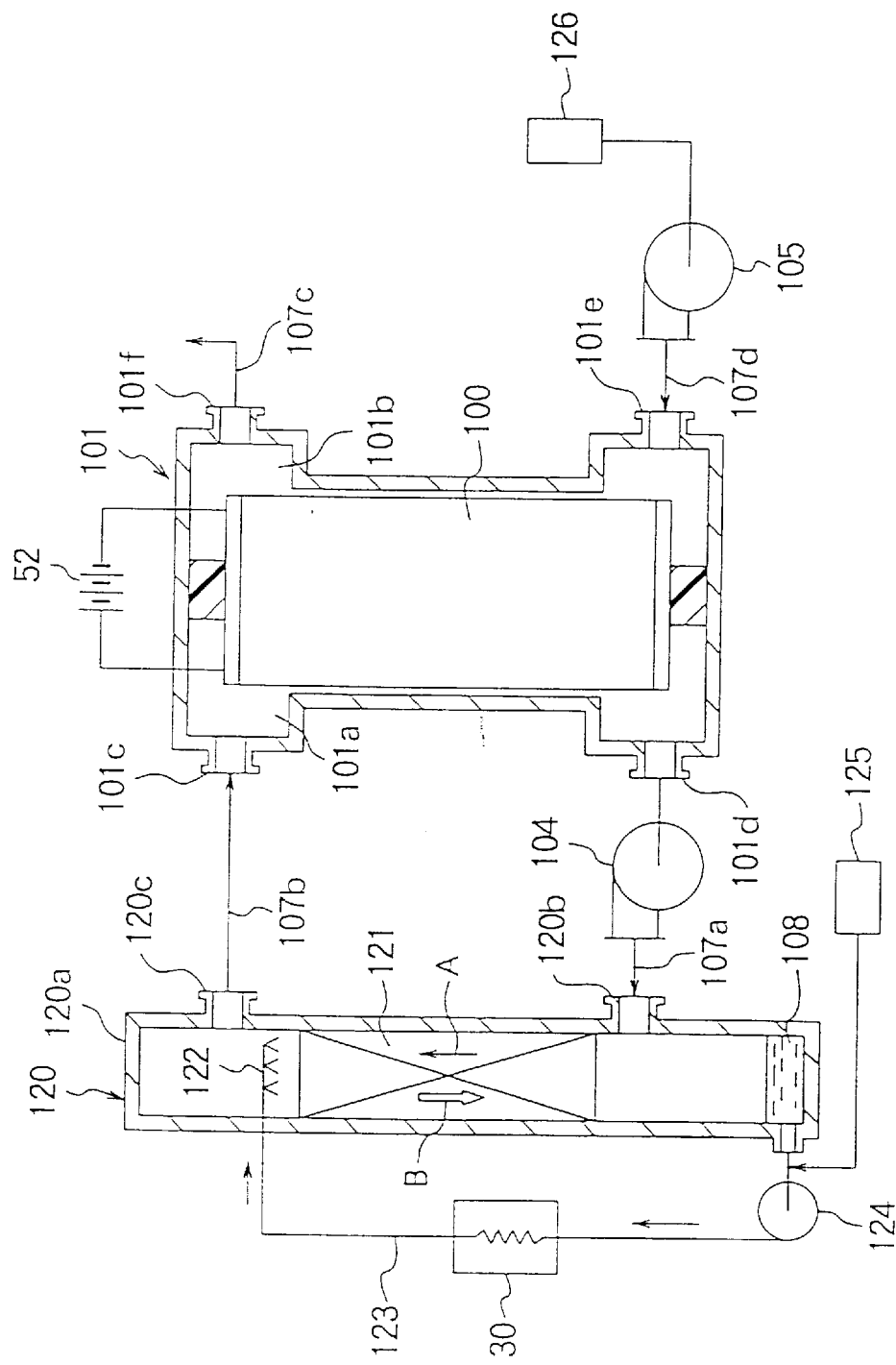
FIG. 17 is a view showing the system arrangement of a water-evaporation type cooling apparatus based on electrolytic reaction according to Embodiment 12 of the present invention.

According to Embodiment 12, as shown in FIG. 17, an anode-side exhaust port 101d and an anode-side inlet port 101c of housing 101 are connected to an inlet port 120b and an exhaust port 120c of a gas-liquid contactor 120 through pipes 107a and 107b, respectively. A blower 104 is arranged in the path of a pipe 107a. A supplementary water supply mechanism 125 is connected to the water-supply side of a circulation-water pump 124.

A blower 105 is connected to a cathode-side inlet port 101e of the housing 101 through a pipe 107d, and a filter 126 is arranged on the intake side of the blower 105. A pipe 107c having an end portion which is opened outside is connected to a cathode-side exhaust port 101f.

The other arrangement is the same as that in Embodiment 11.

According to Embodiment 12, water 108 reserved in the bottom portion of a can member 120a is sprayed from a water spray unit 122, and is brought into countercurrent contact with a gas sent from the inlet port 120b in a filling layer 121 to be evaporated. When the evaporated water is sent into an anode-side space 101a as steam, and the steam flows along the anode-side electrolysis surface, the steam is converted into oxygen. However, water whose amount corresponding to an amount of water consumed in the anode-side circulation path is supplied through the supplementary water supply mechanism 125, and an amount of water 108 reserved in the bottom portion of the can member 120a can be assured. On the other hand, when outside air sent into a cathode-side space 101b by the blower 105 through the filter 126 flows along the cathode-side electrolysis surface, oxygen reacts with hydrogen ions transmitted through a solid-state electrolytic element 100 to generate steam, thereby increasing the humidity. Thereafter, the air is exhausted outside through the pipe 107c.

Therefore, according to Embodiment 12, since water whose amount corresponding to an amount of water consumed in the anode-side circulation path can be supplied through the supplementary water supply mechanism 125, a condenser need not be arranged in the cathode-side circulation path to recover condensed water. The cathode-side circulation path may have an arrangement in which outside air is sent into the cathode-side space 101b by the blower 105, and high-temperature and high-humidity air is exhausted outside. The arrangement can be simplified.
Embodiment 13

Figure 18:
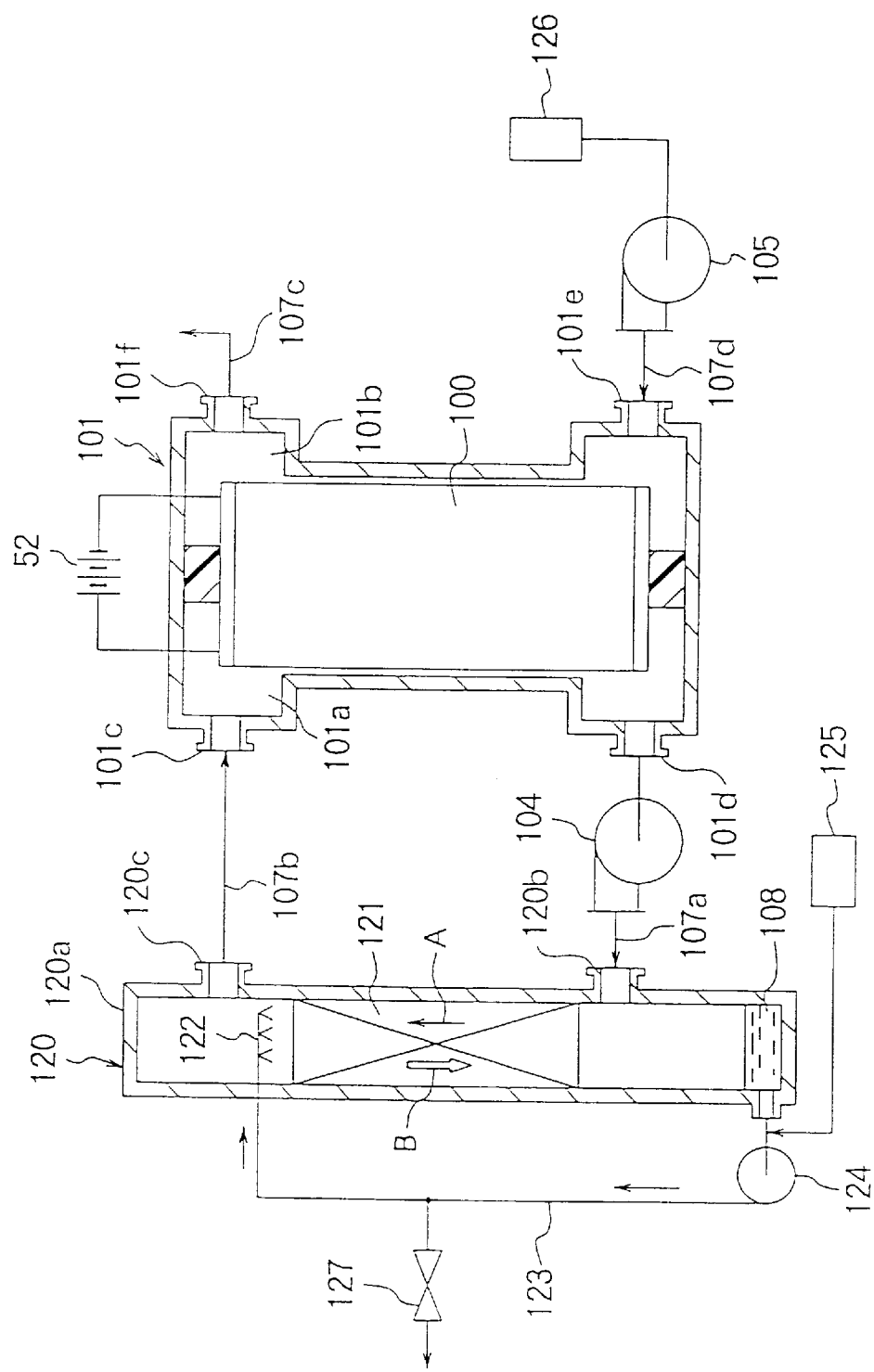
FIG. 18 is a view showing the system arrangement of a water-evaporation type cooling apparatus based on electrolytic reaction according to Embodiment 13 of the present invention.
Figure 19:
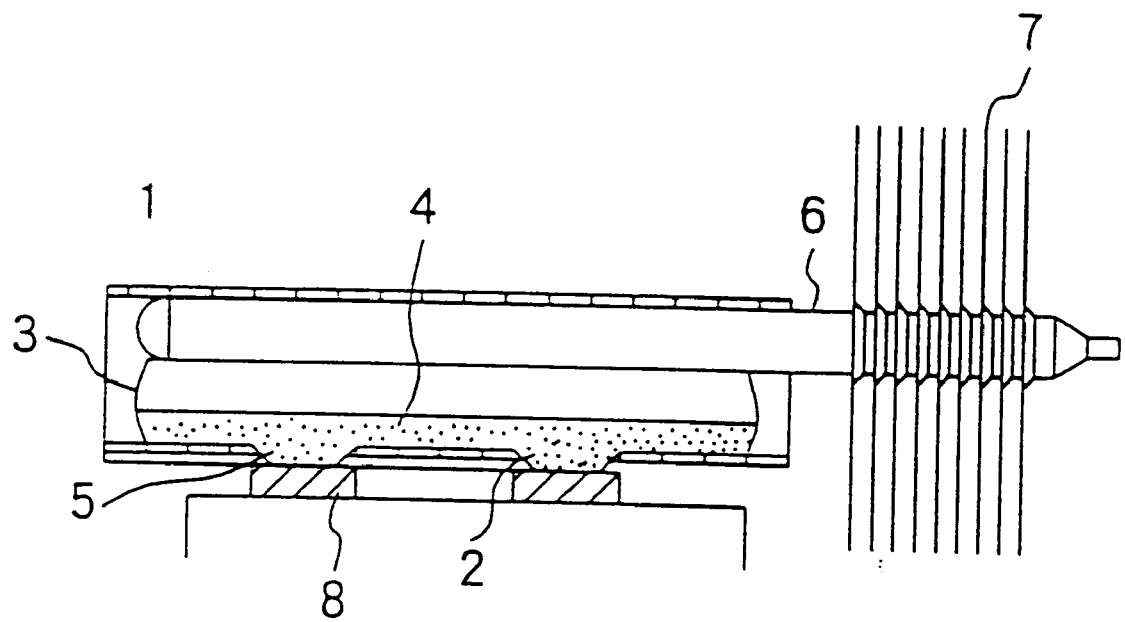
FIG. 19 is a view showing the arrangement of a conventional heat-transfer apparatus.

In Embodiment 13, as shown in FIG. 18, a water-intake valve 127 is arranged in the path of a pipe 123. The other arrangement is the same as that in Embodiment 12.

According to Embodiment 13, water whose temperature is decreased such that the water is brought into countercurrent contact with a gas sent from an inlet port 120b of a gas-liquid contactor 120 can be taken out through the water-intake valve 127. The low-temperature water taken out through the water-intake valve 127 can be used as drinking water, and application of the cooling apparatus can be enlarged.

Since the present invention has the above arrangement, the following effects can be obtained.

According to the present invention, in a water-evaporation type cooling apparatus based on electrolytic reaction, comprising an airtight space having a gas sealed therein; a solid-state electrolytic element which has electrodes arranged on both the surfaces of a solid high polymer electrolytic membrane allowing protons to selectively transmit therethrough and which divides the airtight space into first and second airtight spaces; a DC power supply for applying a DC current to the solid-state electrolytic element such that the electrode on the first airtight space side of the solid-state electrolytic element is used as an anode; water reserved in the first airtight space; a condenser, arranged in the second airtight space, for condensing steam; a water path for causing the water condensed in the second airtight space to return to the first airtight space; and a ventilation path for performing ventilation between gas-phase portions of the first and second airtight spaces, in which a DC current is applied to the solid-state electrolytic element to make electrolysis of steam on a surface of the solid-state electrolytic element on the first airtight space side, protons generated by the electrolysis are supplied to a surface of the solid-state electrolytic element on the second airtight space side through the solid-state electrolytic element, water-generation reaction occurs on the surface of the solid-state electrolytic element on the second airtight space side to generate a humidity difference between the first and second airtight spaces, a temperature of the water reserved in the first airtight space is decreased, and a wall surface of the first airtight space formed along the water whose temperature is decreased is used as a cooling surface, the wall surface of the first airtight space constituting the cooling surface is shaped into an outer surface shape along an outer surface shape of a target object. Therefore, steam and a gas can be circulated without a driving force, and the cooling apparatus can be made soundless and compact. The target object can be efficiently cooled such that the target object is brought into contact with the cooling surface, and water can be used as a refrigerant. As a result, a water-evaporation type cooling apparatus based on electrolytic reaction which poses no problem on environmental protection can be obtained.

The first airtight space is constituted by a first space facing the solid-state electrolytic element and a second space located below the first space to communicate with the first space, a water-bearing layer for reserving water is vertically formed on an inner wall surface of the second space, and the wall surface of the second space along the water-bearing layer is shaped to have an outer surface shape along the outer surface shape of the target object. For this reason, an oxygen gas flows from the first space into the second space and falls along the water-bearing layer to form a low-humidity environment on the surface of the water-bearing layer, and evaporation of water from the surface of the water-bearing layer can be accelerated.

In a water-evaporation type cooling apparatus based on electrolytic reaction, comprising an airtight space having a gas sealed therein; a solid-state electrolytic element which has electrodes arranged on both the surfaces of a solid high polymer electrolytic membrane allowing protons to selectively transmit therethrough and which divides the airtight space into first and second airtight spaces; a DC power supply for applying a DC current to the solid-state electrolytic element such that the electrode on the first airtight space side of the solid-state electrolytic element is used as an anode; water reserved in the first airtight space; a condenser, arranged in the second airtight space, for condensing steam; a water path for causing the water condensed in the second airtight space to return to the first airtight space; and a ventilation path for performing ventilation between gas-phase portions of the first and second airtight spaces, in which a DC current is applied to the solid-state electrolytic element to make electrolysis of steam on a surface of the solid-state electrolytic element on the first airtight space side, protons generated by the electrolysis are supplied to a surface of the solid-state electrolytic element on the second airtight space side through the solid-state electrolytic element, water-generation reaction occurs on the surface of the solid-state electrolytic element on the second airtight space side to generate a humidity difference between the first and second airtight spaces, a temperature of the water reserved in the first airtight space is decreased, and a wall surface of the first airtight space formed along the water whose temperature is decreased is used as a cooling surface, a heat-radiator is arranged in the first airtight space. Therefore, steam and a gas can be circulated without a driving force, and the cooling apparatus can be made soundless and compact. An oxygen gas heated by Joule heat generated in the energizing process for the solid-state electrolytic element is cooled by the heat-radiator to improve cooling efficiency, and water can used as a refrigerant. As a result, a steam type cooling apparatus using electrolysis which poses no problem on environmental protection can be obtained.

The first airtight space is constituted by a first space facing the solid-state electrolytic element and a second space located below the first space to communicate with the first space, a water-bearing layer for reserving water is vertically formed on an inner wall surface of the second space, and the heat-radiator is arranged in the first space. For this reason, an oxygen gas flows from the first space into the second space and falls along the water-bearing layer to form a low-humidity environment on the surface of the water-bearing layer, evaporation of water from the surface of the water-bearing layer can be accelerated. An oxygen gas heated by Joule heat generated in the energizing process for the solid-state electrolytic element is cooled by the heat-radiator to improve cooling efficiency.

When the outside temperature of the heat-radiator is equal to or lower than the upper limit temperature at which the target object is kept cool, power supply to the solid-state electrolytic element is stopped, steam is condensed by the heat-radiator. When the outside temperature of the heat-radiator exceeds the upper limit temperature at which the target object is kept cool, power supply to the solid-state electrolytic element is started, steam is condensed by the condenser. For this reason, power savings can be realized.

Water-bearing layers are formed on opposite inner wall surfaces of the second space, and the opposite wall surfaces of the second space along the water-bearing layers are shaped to have outer surface shapes along the outer surface of the target object. For this reason, a cooing area can be increased, and a decrease in size can be performed.

The water-bearing layers are formed such that uneven opposite wall surfaces of the second space are engaged with each other. For this reason, the apparatus can be decreased in size, and a pair of target objects can be arranged such that uneven surfaces of the target objects are engaged with each other. As a result, equipment which is excellent in earthquake resistance and shock resistance can be constituted.

Water is reserved in a bottom portion of the second space, a lower portion of the water-bearing layer is dipped in the water, the bottom portion of the second space is caused to communicate with the bottom portion of the second airtight space through the water path to constitute a water-sealing structure between the second space and the second airtight space, and a portion near a portion above the reserved water surface in the bottom portion of the second space is caused to communicate with the second airtight space through the ventilation path. For this reason, a pressure difference is made between the second space and the second airtight space, and, therefore, an oxygen gas having a large specific weight can be sent to the second airtight space without a driving force and a special mechanism.

A catalyst layer for converting a hydrogen gas into water is arranged at a top portion of the second airtight space. For this reason, even if part of hydrogen ions are converted into a hydrogen gas without reacting with oxygen on the cathode surface, and the hydrogen gas is reserved in the top portion of the second airtight space, the hydrogen gas is rapidly converted into water. Therefore, dangerous residence of the hydrogen gas can be prevented.

The catalyst layer is formed to have a ventilation structure, a ventilation path outlet is arranged at the top portion of the second airtight space, and the catalyst layer is arranged at the ventilation path outlet. For this reason, an oxygen gas and a hydrogen gas sent through the ventilation path are brought into countercurrent contact with each other in the catalyst layer to enhance hydrogen gas consumption, thereby improving safety.

The catalyst layer consists of platinum-group metal fine particles or a material obtained by carrying a platinum-group metal on a metal oxide. For this reason, a hydrogen gas can be efficiently converted into water.

The solid-state electrolytic element is shaped into a corrugate shape such that the solid high polymer electrolytic membrane having electrodes formed on both the surfaces thereof is alternately bent from the first airtight space side to the second airtight space side and from the second airtight space side to the first airtight space side. For this reason, the electrolysis surface can be considerably increased, cooling performance can be improved, and a decrease in size can be performed.

In a water-evaporation type cooling apparatus based on electrolytic reaction, comprising a solid-state electrolytic element formed such that a solid-state polymer electrolytic film which has an anode formed on one surface thereof and a cathode formed on the other surface and allows protons to selectively transmit therethrough is shaped into a corrugate-fin-like stereoscopic shape; a housing, for storing the solid-state electrolytic element to partition it in an anode-side space and a cathode-side space, having an anode-side inlet port and an anode-side outlet port which communicate with the anode-side space and a cathode-side inlet port and a cathode-side outlet port which communicate with the cathode-side space; a DC power supply for applying a DC current to the solid-state electrolytic element; an evaporator, having an evaporator inlet port and an evaporator outlet port, for evaporating water reserved in the evaporator; and a condenser, having a condenser inlet port and a condenser outlet port, for condensing steam, the evaporator inlet port and the evaporator outlet port, and the anode-side outlet port and the anode-side inlet port respectively communicate with each other through pipes to constitute an anode-side circulation path for making circulation between the anode-side space and the evaporator, the condenser inlet port and the condenser outlet port, and the cathode-side outlet port and the cathode-side inlet port respectively communicate with each other through pipes to constitute a cathode-side circulation path for making circulation between the cathode-side space and the condenser, and a blower is arranged in at least one of the anode-side circulation path and the cathode-side circulation path to cause the blower to forcibly circulate a gas filled in the corresponding circulation path. For this reason, an electrolysis surface and a heat-material transfer surface can be held in a turbulent flow area or a laminar flow area, and the electrolytic reaction and heat-material transfer can be performed at a high speed. The solid-state electrolytic element is formed into a corrugate-fin-like stereoscopic shape to considerably increase the electrolysis surface, thereby improving cooling performance. A decrease in size can be performed, and water can be used as a refrigerant. As a result, a water-evaporation type cooling apparatus based on electrolytic reaction which poses no problem on environmental protection can be obtained.

The anode-side circulation path comprises a first anode-side circulation path which extends from an exhaust side of an anode-side blower to an intake side of the anode-side blower through the anode-side inlet port, the anode-side space and the anode-side outlet port, and a second anode-side circulation path which is branched from the first anode-side circulation path on the exhaust side of the anode-side blower, extends through the evaporator inlet port, the evaporator and the evaporator outlet port, and joins the first anode-side circulation path on the intake side of the anode-side blower, and the cathode-side circulation path comprises a first cathode-side circulation path which extends from an exhaust side of an cathode-side blower to an intake side of the cathode-side blower through the cathode-side inlet port, the cathode-side space and the cathode-side outlet port, and a second cathode-side circulation path which is branched from the first cathode-side circulation path on the exhaust side of the cathode-side blower, extends through the condenser inlet port, the condenser and the condenser outlet port, and joins the first cathode-side circulation path on the intake side of the cathode-side blower. The temperature of a gas circulated in the first cathode-side circulation path can be kept at a temperature higher than the temperature of a refrigerant for cooling the condenser without using a special external heat source, and the apparatus can be reduced in size. Heat transferred to the second anode-side circulation path can be reduced, so that cooling performance can be improved.

The evaporator comprises a can member for reserving water and a water-bearing layer formed on an inner wall surface of the can member to have an end portion dipped in the water, the gas is sent from the evaporator inlet port by the anode-side blower to be forcibly circulated along a surface of the water-bearing layer, and an outer surface of a portion of the can member on which the water-bearing layer is formed is used as a heat-transfer surface thermally connected to a target object. For this reason, the water-bearing layer surface is held in a turbulent flow area or a laminar flow area, the speed of moisture evaporation from the bearing-layer surface is made high, and the target object can be cooled at a high speed.

The gas filled in the anode-side circulation path and the cathode-side circulation path is oxygen or oxygen-enriched air. For this reason, the speed of electrolysis can be made high, and the solid-state electrolytic element can be decreased in scale.

A platinum-based metal catalyst layer is arranged in a path of the cathode-side circulation path to remove a hydrogen gas in a gas circulated in the cathode-side circulation path. For this reason, an amount of hydrogen gas in the path can be reduced, and safety can be assured.

In a water-evaporation type cooling apparatus based on electrolytic reaction, comprising a solid-state electrolytic element formed such that a solid high polymer electrolytic membrane which has an anode formed on one surface thereof and a cathode formed on the other surface and allows protons to selectively transmit therethrough is shaped into a corrugate-fin-like stereoscopic shape; a housing, for storing the solid-state electrolytic element to partition it into an anode-side space and a cathode-side space, having an anode-side inlet port and anode-side outlet port which communicate with the anode-side space and a cathode-side inlet port and a cathode-side outlet port which communicate with the cathode-side space; a DC power supply for applying a DC current to the solid-state electrolytic element; and a gas-liquid contactor which stores a filling layer to vertically partition it into an upper space and a lower space, has an outlet port communicating with the upper space and an inlet port communicating with the lower space, and has water reserved in a bottom portion thereof, the inlet port and the outlet port of the gas-liquid contactor, and the anode-side outlet port and the anode-side inlet port respectively communicate with each other through pipes to constitute an anode-side circulation path for making circulation between the anode-side space and the gas-liquid contactor, a blower is arranged in the anode-side circulation path to cause the blower to forcibly circulate the water reserved in the bottom portion of the gas-liquid contactor, the bottom portion of the gas-liquid contactor communicates with the upper space of the gas-liquid contactor by a water-circulation circuit, and water reserved in the bottom portion of the gas-liquid contactor is circulated by the water-circulation circuit, and the water and the gas are brought into countercurrent contact with each other in the filling layer. For this reason, an electrolysis surface and a heat-material transfer surface can be held in a turbulent flow area or a laminar flow area, and the electrolysis and heat-material transfer can be performed at a high speed. In the filling layer, water can be efficiently decreased in temperature such that the water is brought into countercurrent contact with a gas decreased in humidity in the anode-side space. The solid-state electrolytic element is formed into a corrugate-fin-like stereoscopic shape to considerably increase the electrolysis surface, thereby improving cooling performance. A decrease in size can be performed, and water can be used as a refrigerant. As a result, a steam type cooling apparatus using electrolysis which poses no problem on environmental protection can be obtained.

A cooling-water circuit for a target object is incorporated in the water-circulation circuit. For this reason, the target object can be cooled by cooled water, an application range and application development can be enlarged.

A water supply mechanism for charging external water to the gas-liquid contactor is arranged, and a water-intake mechanism for taking water out is arranged at a portion of the water-circulation circuit. For this reason, water need not be recovered by the cathode-side circulation path, and the arrangement can be simplified and decreased in size. In addition, the cooling water can be used as not only cooling water, but also drinking water, and the application range and application development can be more enlarged.

I claim:

1. A water-evaporation cooling apparatus based on electrolytic reaction comprising:
    an airtight space having a gas sealed therein;
    a solid-state electrolytic element which has electrodes arranged on two surfaces of a solid high polymer electrolytic membrane allowing protons to selectively transmit therethrough and which divides said airtight space into first and second airtight spaces;
    a DC power supply for applying a DC current to said solid-state electrolytic element such that said electrode on said first airtight space side of said solid-state electrolytic element is used as an anode;
    a condenser, arranged in said second airtight space, for condensing steam into water;
    a water path for causing the water condensed in said second airtight space to return to said first airtight space; and
    a ventilation path for performing ventilation between gas-phase portions of said first and second airtight spaces,
    wherein the wall surface of said first airtight space is shaped into an outer surface shape along an outer surface shape of a target object.

2. A water-evaporation cooling apparatus based on electrolytic reaction according to claim 1,
    characterized in that said first airtight space is constituted by a first space facing said solid-state electrolytic element and a second space located below said first space to communicate with said first space, a water-bearing layer for reserving water is vertically formed on an inner wall surface of said second space, and the wall surface of said second space along said water-bearing layer is shaped to have an outer surface shape along the outer surface shape of said target object.

3. A water-evaporation cooling apparatus based on electrolytic reaction according to claim 2,
    characterized in that water-bearing layers are formed on opposite inner wall surfaces of said second space, and the opposite wall surfaces of said second space along said water-bearing layers are shaped to have outer surface shapes along the outer surface of said target object.

4. A water-evaporation cooling apparatus based on electrolytic reaction according to claim 3,
    characterized in that said water-bearing layers are formed such that uneven opposite wall surfaces of the second space are engaged with each other.

5. A water-evaporation cooling apparatus based on electrolytic reaction according to claim 1,
    characterized in that said first airtight space is constituted by a first space facing said solid-state electrolytic element and a second space located below said first space to communicate with said first space, and further characterized in that water is reserved in a bottom portion of said second space, a lower portion of said water-bearing layer is dipped in the water, the bottom portion of said second space is caused to communicate with the bottom portion of said second airtight space through said water path to constitute a water-sealing structure between said second space and said second airtight space, and a portion near a portion above the reserved water surface in the bottom portion of said second space is caused to communicate with said second airtight space through said ventilation path.

6. A water-evaporation cooling apparatus based on electrolytic reaction according to claim 2,
    characterized in that a catalyst layer for converting a hydrogen gas into water is arranged at a top portion of said second airtight space.

7. A water-evaporation cooling apparatus based on electrolytic reaction according to claim 6,
    characterized in that said catalyst layer is formed to have a ventilation structure, a ventilation path outlet is arranged at the top portion of said second airtight space, and said catalyst layer is arranged at said ventilation path outlet.

8. A water-evaporation cooling apparatus based on electrolytic reaction according to claim 2,
    characterized in that said solid-state electrolytic element is shaped into a corrugate shape such that said solid high polymer electrolytic membrane having electrodes formed on both the surfaces thereof is alternately bent from the first airtight space side to the second airtight space side and from the second airtight space side to the first airtight space side.

9. A water-evaporation cooling apparatus based on electrolytic reaction, comprising:

a solid-state electrolytic element formed such that a solid high polymer electrolytic membrane which has an anode formed on one surface thereof and a cathode formed on the other surface and allows protons to selectively transmit therethrough is shaped into a corrugate-fin-like stereoscopic shape;

a housing, for storing said solid-state electrolytic element to partition it into an anode-side space and a cathode-side space, having an anode-side inlet port and an anode-side outlet port which communicate with said anode-side space and a cathode-side inlet port and a cathode-side outlet port which communicate with said cathode-side space;

a DC power supply for applying a DC current to said solid-state electrolytic element;

an evaporator, having an evaporator inlet port and an evaporator outlet port, for evaporating water reserved in said evaporator; and a condenser, having a condenser inlet port and a condenser outlet port, for condensing steam into water, characterized in that said evaporator inlet port and said evaporator outlet port, and said anode-side outlet port and said anode-side inlet port respectively communicate with each other through pipes to constitute an anode-side circulation path for making circulation between the anode-side space and said evaporator, said condenser inlet port and said condenser outlet port, and said cathode-side outlet port and said cathode-side inlet port respectively communicate with each other through pipes to constitute a cathode-side circulation path for making circulation between said cathode-side space and said condenser, and a blower is arranged in at least one of said anode-side circulation path and said cathode-side circulation path to forcibly circulate a gas filled in the corresponding circulation path.

10. A water-evaporation cooling apparatus based on electrolytic reaction according to claim 9, characterized in that said anode-side circulation path comprises a first anode-side circulation path which extends from an exhaust side of an anode-side blower to an intake side of the anode-side blower through said anode-side inlet port, said anode-side space and said anode-side outlet port, and a second anode-side circulation path which is branched from said first anode-side circulation path on the exhaust side of said anode-side blower, extends through said evaporator inlet port, said evaporator and said evaporator outlet port, and joins said first anode-side circulation path on the intake side of said anode-side blower, and said cathode-side circulation path comprises a first cathode-side circulation path which extends from an exhaust side of an cathode-side blower to an intake side of the cathode-side blower through said cathode-side inlet port, said cathode-side space and said cathode-side outlet port, and a second cathode-side circulation path which is branched from said first cathode-side circulation path on the exhaust side of said cathode-side blower, extends through said condenser inlet port, said condenser and said condenser outlet port, and joins said first cathode-side circulation path on the intake side of said cathode-side blower.

11. A water-evaporation cooling apparatus based on electrolytic reaction according to claim 10, wherein said evaporator comprises;

a can for reserving water, a water-bearing layer formed on an inner wall surface of said can, wherein an end portion of said water-bearing layer is dipped into the water, and the gas is directed from said evaporator inlet port and circulated along a surface of said water-bearing layer, and wherein further, an outer surface of a portion of said can is used as a heat-transfer surface thermally connected to a target object.

12. A water-evaporation cooling apparatus based on electrolytic reaction according to claim 10, characterized in that the gas filled in said anode-side circulation path and said cathode-side circulation path is oxygen or oxygen-enriched air.

13. A water-evaporation cooling apparatus based on electrolytic reaction according to claim 9, characterized in that a platinum-based metal catalyst layer is arranged in a path of said cathode-side circulation path to remove a hydrogen gas in a gas circulated in said cathode-side circulation path.

14. A water-evaporation cooling apparatus based on electrolytic reaction, comprising:

a solid-state electrolytic element formed such that a solid high polymer electrolytic membrane which has an anode formed on one surface thereof and a cathode formed on the other surface and allows protons to selectively transmit therethrough is shaped into a corrugate-fin-like stereoscopic shape;

a housing, for storing said solid-state electrolytic element to partition it into an anode-side space and a cathode-side space, having an anode-side inlet port and anode-side outlet port which communicate with the anode-side space and a cathode-side inlet port and a cathode-side outlet port which communicate with the cathode-side space;

a DC power supply for applying a DC current to said solid-state electrolytic element;

a gas-liquid contactor storing a filling layer, said gas-liquid contactor further comprised of;

an upper space and a lower space separated by said filling layer, an outlet port communicating with the upper space and an inlet port communicating with the lower space, wherein said inlet port and said outlet port, and said anode-side outlet port and said anode-side inlet port respectively communicate with each other through pipes and wherein said water-evaporation cooling apparatus is further comprised of, an anode-side circulation path between said anode-side space and said gas-liquid contactor, a blower arranged in said anode-side circulation path circulating gas in said anode-side circulation path, a water-circulation circuit communicating with said bottom space of said gas-liquid contactor, wherein water reserved in said bottom space of said gas-liquid contactor is circulated, and the water and the gas are brought into countercurrent contact with each other in said filling layer.

15. A water-evaporation cooling apparatus based on electrolytic reaction according to claim 14, characterized in that a cooling-water circuit for a target object is incorporated in said water-circulation circuit.

16. A water-evaporation cooling apparatus based on electrolytic reaction according to claim 14, wherein said water-evaporation type cooling apparatus is further comprised of, a water supply mechanism in communication with said gas-liquid contactor charging external water to said gas-liquid contactor, and a water-intake mechanism in communication with said water-circulation circuit removing water from said water-circulation circuit.

\* \* \* \* \*